United States Patent
Muraki

[11] Patent Number: 5,939,725
[45] Date of Patent: Aug. 17, 1999

[54] ELECTRON BEAM EXPOSURE APPARATUS

[75] Inventor: Masato Muraki, Inagi, Japan

[73] Assignee: Canon Kabushiki Kaisha, Tokyo, Japan

[21] Appl. No.: 09/015,788

[22] Filed: Jan. 29, 1998

[30] Foreign Application Priority Data

Jan. 31, 1997 [JP] Japan .................................. 9-018791

[51] Int. Cl.[6] .................................................. G06F 15/46
[52] U.S. Cl. .................................. 250/492.22; 250/491.1
[58] Field of Search .......................... 250/492.22, 491.1, 250/492.2

[56] References Cited

U.S. PATENT DOCUMENTS

| | | | |
|---|---|---|---|
| 4,947,047 | 8/1990 | Muraki | 250/492.2 |
| 4,974,919 | 12/1990 | Muraki et al. | 350/6.6 |
| 5,153,773 | 10/1992 | Muraki et al. | 359/619 |
| 5,345,292 | 9/1994 | Shiozawa et al. | 355/67 |
| 5,363,170 | 11/1994 | Muraki | 355/67 |
| 5,448,357 | 9/1995 | Muraki | 356/356 |
| 5,463,497 | 10/1995 | Muraki et al. | 359/618 |
| 5,499,076 | 3/1996 | Muraki | 355/53 |
| 5,715,084 | 2/1998 | Takahashi et al. | 359/487 |
| 5,831,273 | 11/1998 | Someda | 250/492.22 |

FOREIGN PATENT DOCUMENTS 7-169665  7/1995  Japan .

*Primary Examiner*—Kiet T. Nguyen
*Attorney, Agent, or Firm*—Fitzpatrick, Cella, Harper & Scinto

[57] ABSTRACT

This invention relates to an electron beam exposure apparatus which draws a pattern by accelerating an electron beam emitted by an electron source using an acceleration electrode, and irradiating the electron beam onto a wafer placed on a stage. Deviations DDX and DDY between the irradiated position of the electron beam with respect to the stage at a first acceleration voltage, and that at a second acceleration voltage higher than the first acceleration voltage are detected. The positional relationship between the wafer and the irradiated position of the electron beam with respect to the wafer at the second acceleration voltage is detected. Based on the deviations DDX and DDY and the positional relationship, the positional relationship between the wafer and the irradiated position of the electron beam with respect to the wafer at the first acceleration voltage is calculated.

37 Claims, 18 Drawing Sheets

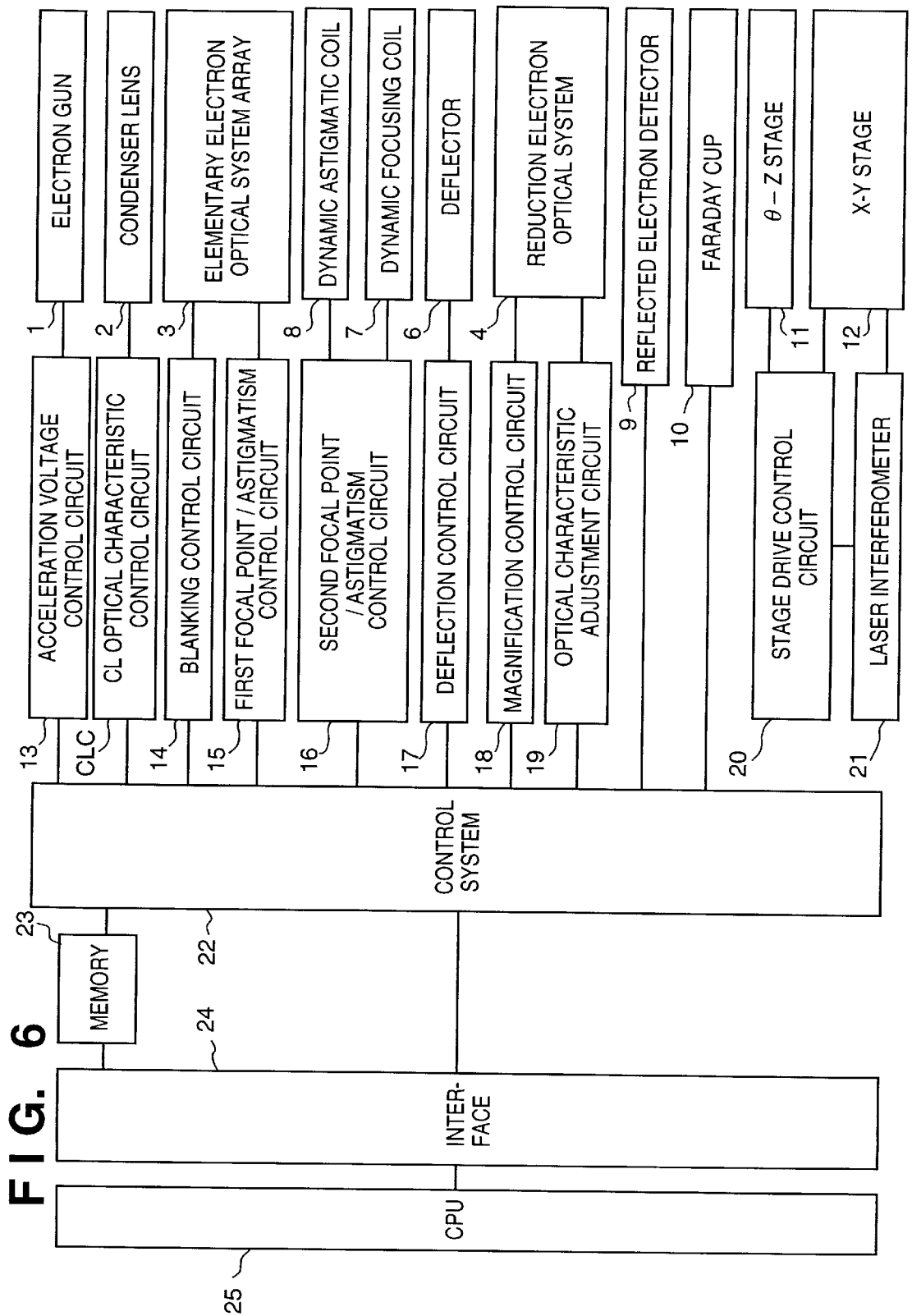

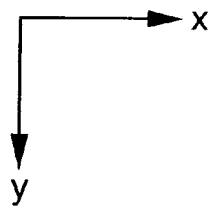
FIG. 8
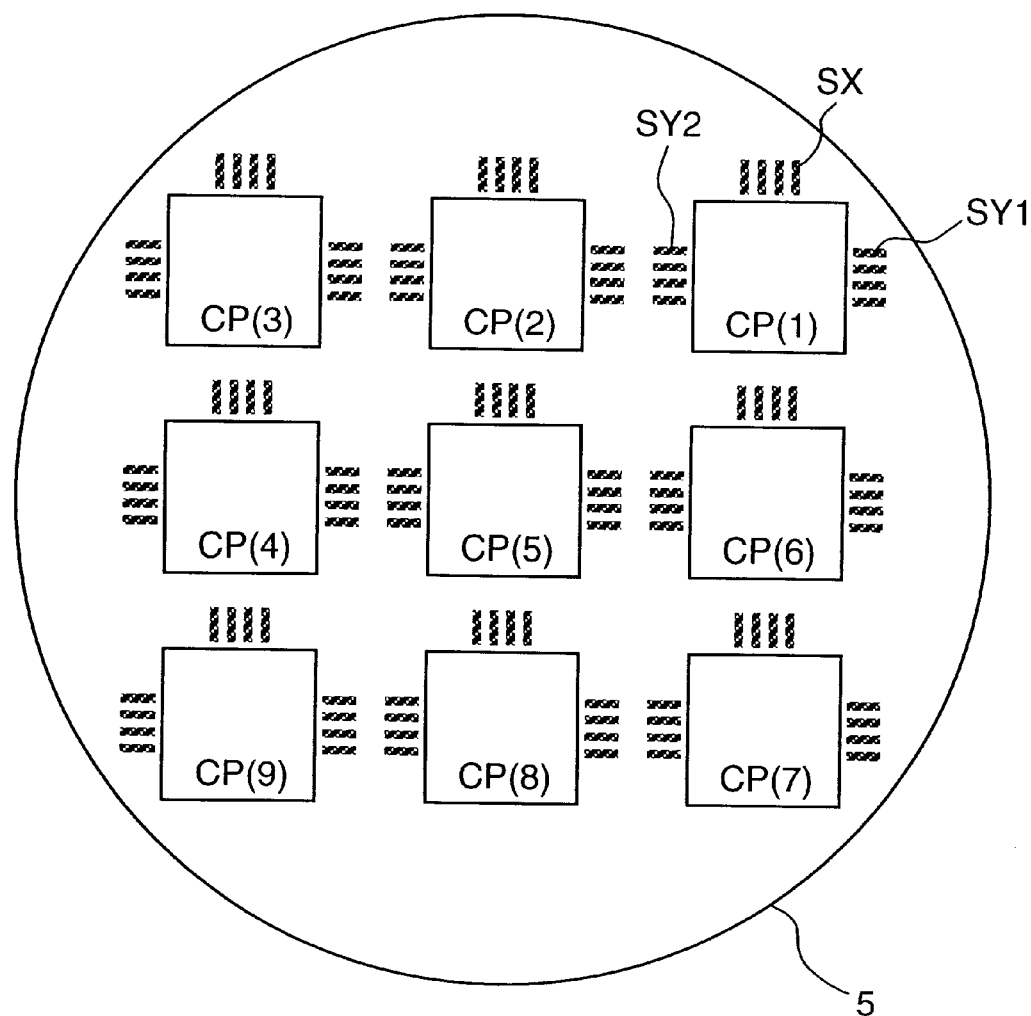

STAGE MOVING DIRECTION

SEMICONDUCTOR DEVICE MANUFACTURING FLOW

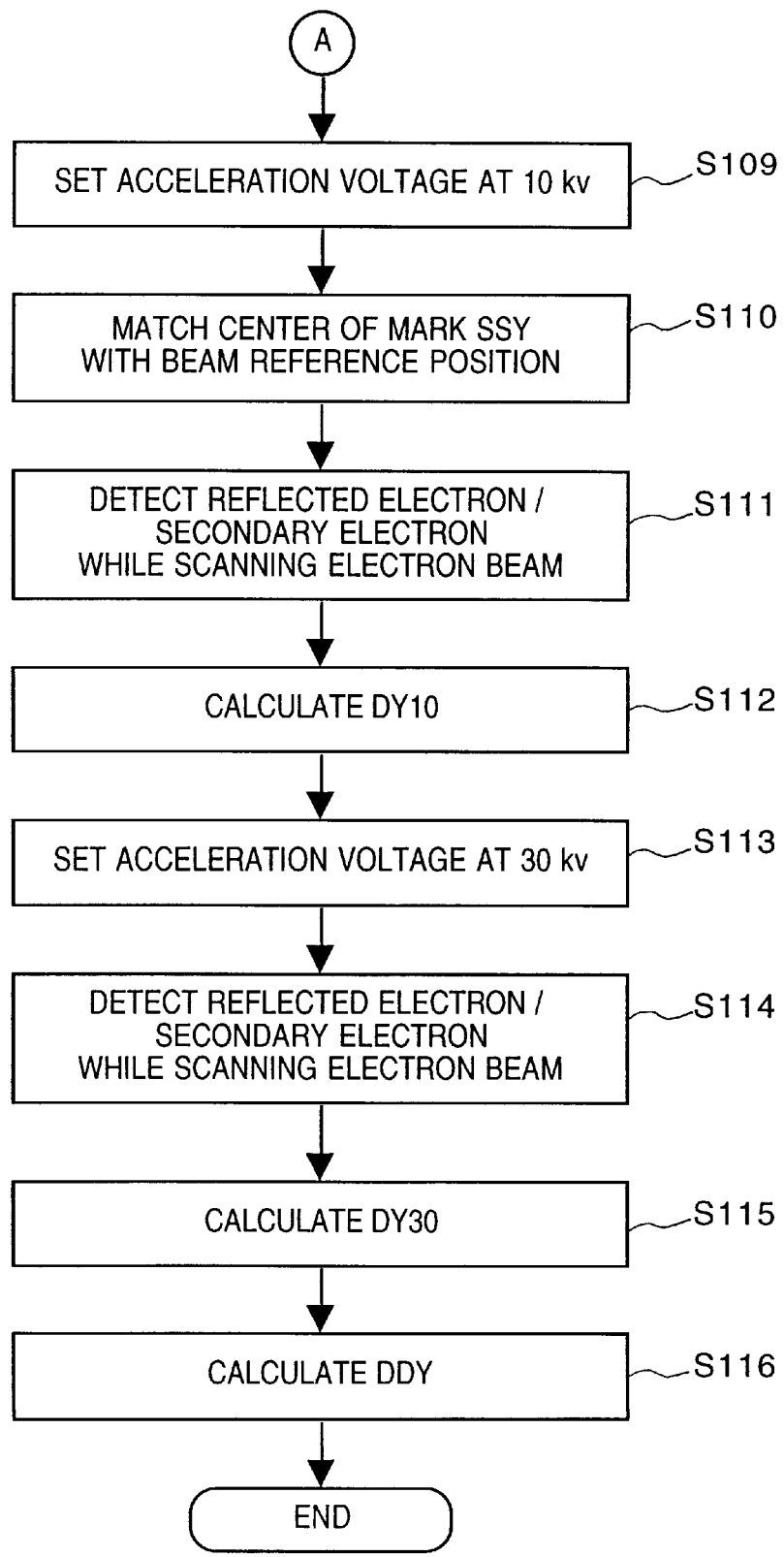

F I G. 16A
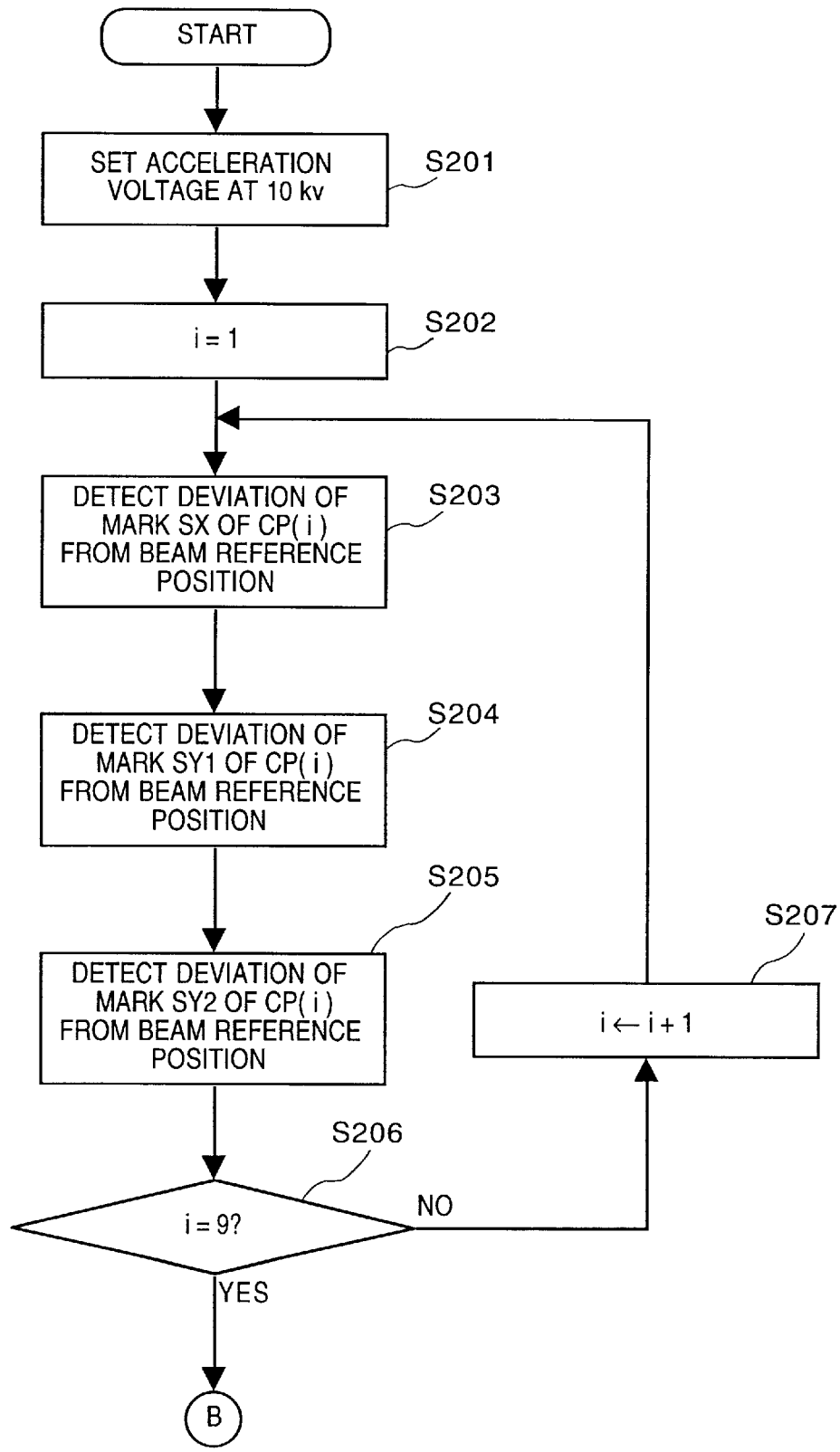

ELECTRON BEAM EXPOSURE APPARATUS

BACKGROUND OF THE INVENTION

The present invention relates to an electron beam exposure apparatus and its control method and, more particularly, to an electron beam exposure apparatus which irradiates an electron beam onto the object to be exposed such as a wafer placed on a stage and drawing a desired pattern on the object to be exposed, and its control method.

An electron beam exposure apparatus and its control method according to the present invention are suitably used for accurately detecting the position of a mark on a wafer applied with a resist, and accurately drawing a new pattern in correspondence with the position of the pattern already formed on the wafer.

An electron beam exposure apparatus draws a new pattern in correspondence with the position of the pattern already formed on a wafer. In order to attain such aligned drawing, the position of a position alignment mark formed on the wafer is detected in advance, and a new pattern is drawn with reference to the detected position.

FIG. 13 shows a conventional point beam type electron beam exposure apparatus using a spot-like beam. Reference numeral 201 denotes an electron gun for emitting an electron beam and ON/OFF-controlling emission of the electron beam in accordance with the pattern to be drawn; 202, a reduction electron optical system for projecting the electron beam coming from the electron gun onto a wafer 203 in a reduced scale with a point shape; 204, a deflector for scanning the point-like electron beam on the wafer; 205, an X-Y stage which moves while carrying the wafer; and 206, a detector for detecting reflected electrons and secondary electrons produced when a position alignment mark on the wafer is scanned with the electron beam.

With the above arrangement, conventionally, when a new pattern is drawn on a predetermined pattern region as one of a plurality of pattern regions already formed on the wafer, a linear position alignment mark of the predetermined pattern region formed on the wafer is located near a reference position of the point-like electron beam using the X-Y stage 206. Subsequently, the electron beam is scanned on the alignment mark by the deflector 204, and reflected electron and secondary electrons coming from the linear alignment mark at that time are detected by the detector 206. Based on the scanning position and the amount of reflected electrons/ secondary electrons detected at that position, the position of the position alignment mark with respect to the reference position of the electron beam is determined. After that, the electron beam is scanned with reference to the determined position of the position alignment mark, and is ON/OFF-controlled in accordance with the pattern to be drawn, thus drawing a new pattern on the wafer.

FIG. 14A shows a plan view and sectional view of the position alignment mark on the wafer, FIG. 14B shows the scanning position when an electron beam at an acceleration voltage of 10 kV is used, and an alignment signal as the amount of reflected electrons/secondary electrons detected at that position, and FIG. 14C shows the scanning position when an electron beam at an acceleration voltage of 30 kV is used, and an alignment signal as the amount of reflected electrons/secondary electrons detected at that position.

As shown in FIG. 14B, when an electron beam at low acceleration voltage is used, the alignment signal has a low S/N ratio. This is because the electron beam is absorbed by a resist that covers the mark and reflected electrons/ secondary electrons from the alignment mark become scarcer as the beam has a lower acceleration voltage. Hence, an electron beam at higher acceleration voltage is preferably used in position alignment.

However, upon drawing (by exposure) a pattern on a resist using an electron beam, when the irradiated electron beam repeats electron scattering in the resist and back scattering from a substrate, charges are accumulated on a portion from around the irradiated position, and that portion is exposed. As the electron beam has higher acceleration voltage, since a broader region other than the irradiated position is exposed, the pattern to be drawn is distorted. Also, as the electron beam has higher acceleration voltage, the linearities of sensitivity of the resist and that for the irradiation amount worsen. Hence, an electron beam at low acceleration voltage is preferably used in pattern drawing (exposure).

Conventionally, the acceleration voltage is determined giving priority to one of position alignment and pattern drawing purposes.

SUMMARY OF THE INVENTION

It is an object of the present invention to align patterns with higher accuracy, and to satisfactorily draw a pattern.

According to the present invention, the foregoing object is attained by providing an electron beam exposure apparatus which draws a pattern on an object to be exposed by accelerating an electron beam emitted by an electron source using an acceleration electrode, and irradiating the electron beam onto the object to be exposed placed on a stage via an electron optical system, comprising: deviation detection means for detecting a deviation between an irradiated position of the electron beam with respect to the stage upon applying a first acceleration voltage to the acceleration electrode, and an irradiated position of the electron beam with respect to the stage upon applying a second acceleration voltage higher than the first acceleration voltage to the acceleration electrode; positional relationship detection means for detecting a positional relationship between the object to be exposed placed on the stage and an irradiated position of the electron beam with respect to the object to be exposed upon applying the second acceleration voltage to the acceleration electrode; and calculation means for calculating a positional relationship between the object to be exposed and the position of the electron beam with respect to the object to be exposed upon applying the first acceleration voltage to the acceleration electrode, on the basis of the deviation detected by the deviation detection means, and the positional relationship detected by the positional relationship detection means.

According to an embodiment, alignment means for aligning a position of the object to be exposed and the irradiated position of the electron beam on the basis of the positional relationship between the object to be exposed and the irradiated position of the electron beam at the first acceleration voltage, which relationship is calculated by the calculation means, and drawing means for drawing a pattern on the object to be exposed using the electron beam accelerated at the first acceleration voltage by applying the first acceleration voltage to the acceleration electrode after the alignment by the alignment means.

According to an embodiment, the deviation detection means comprises: first detection means for detecting a positional relationship between the stage, and the irradiated position of the electron beam with respect to the stage, upon applying the first acceleration voltage to the acceleration electrode; second detection means for detecting a positional relationship between the stage, and the irradiated position of the electron beam with respect to the stage, upon applying the second acceleration voltage to the acceleration electrode; and means for calculating the deviation between the irradiated positions of the electron beams at the first and second acceleration voltages on the basis of detection results of the first and second detection means.

According to an embodiment, the first and second position detection means each detect the positional relationship between the stage and the irradiated position of the electron beam by scanning the electron beam on a mark formed on the stage, and analyzing reflected electrons or secondary electrons coming from the mark at that time.

According to an embodiment, the positional relationship detection means detects the positional relationship between the object to be exposed, and the irradiated position of the electron beam, by scanning the electron beam on a mark formed on the object to be exposed, and analyzing reflected electrons or secondary electrons coming from the mark at that time.

According to an embodiment, optical characteristic correction means for correcting optical characteristics of the electron optical system in accordance with the set acceleration voltage.

According to an embodiment, aberration correction means for correcting aberrations produced upon irradiating the electron beam onto the object to be exposed via the electron optical system.

According to another aspect of the present invention, the foregoing object is attained by providing an electron beam exposure apparatus for drawing a pattern on an object to be exposed by irradiating an electron beam onto the object to be exposed placed on a stage, comprising: electron beam generation means for selectively generating a first electron beam accelerated at a first acceleration voltage or a second electron beam accelerated at a second acceleration voltage higher than the first acceleration voltage; deviation detection means for detecting a deviation between an irradiated position of the first electron beam with respect to the stage, and an irradiated position of the second electron beam with respect to the stage; positional relationship detection means for detecting a positional relationship between the object to be exposed placed on the stage, and an irradiated position of the second electron beam with respect to the object to be exposed; and calculation means for calculating a positional relationship between the object to be exposed, and an irradiated position of the first electron beam with respect to the object to be exposed, on the basis of the deviation detected by the deviation detection means, and the positional relationship detected by the positional relationship detection means.

According to an embodiment, alignment means for aligning a position of the object to be exposed and the irradiated position of the first electron beam on the basis of the positional relationship between the object to be exposed and the irradiated position of the first electron beam, which relationship is calculated by the calculation means, and drawing means for drawing a pattern on the object to be exposed using the first electron beam after the alignment by the alignment means.

According to an embodiment, the deviation detection means comprises: first detection means for detecting a positional relationship between the stage, and the irradiated position of the first electron beam with respect to the stage; second detection means for detecting a positional relationship between the stage, and the irradiated position of the second electron beam with respect to the stage; and means for calculating the deviation between the irradiated positions of the first and second electron beams on the basis of detection results of the first and second detection means.

According to an embodiment, the first and second position detection means each detect the positional relationship between the stage and the irradiated position of the electron beam by scanning the electron beam on a mark formed on the stage, and analyzing reflected electrons or secondary electrons coming from the mark at that time.

According to an embodiment, the positional relationship detection means detects the positional relationship between the object to be exposed, and the irradiated position of the electron beam, by scanning the electron beam on a mark formed on the object to be exposed, and analyzing reflected electrons or secondary electrons coming from the mark at that time.

According to an embodiment, the electron beam generation means comprises: an electron gun; an acceleration electrode for accelerating an electron beam emitted by the electron gun; and an acceleration voltage control circuit for setting an acceleration voltage to be applied to the acceleration electrode at the first or second acceleration voltage.

According to an embodiment, an electron optical system arranged between the electron beam generation means and the stage, and optical characteristic correction means for correcting optical characteristics of the electron optical system in accordance with the acceleration voltage.

According to an embodiment, aberration correction means for correcting aberrations produced upon irradiating the electron beam onto the object to be exposed via the electron optical system.

According to an embodiment, an electron optical system arranged between the electron beam generation means and the stage, and optical characteristic correction means for correcting optical characteristics of the electron optical system in accordance with the acceleration voltage.

According to an embodiment, aberration correction means for correcting aberrations produced upon irradiating the electron beam onto the object to be exposed via the electron optical system.

According to another aspect of the present invention, the foregoing object is attained by providing a method of controlling an electron beam exposure apparatus which draws a pattern on an object to be exposed by accelerating an electron beam emitted by an electron source using an acceleration electrode, and irradiating the electron beam onto the object to be exposed placed on a stage via an electron optical system, comprising: the deviation detection step of detecting a deviation between an irradiated position of the electron beam with respect to the stage upon applying a first acceleration voltage to the acceleration electrode, and an irradiated position of the electron beam with respect to the stage upon applying a second acceleration voltage higher than the first acceleration voltage to the acceleration electrode; the positional relationship detection step of detecting a positional relationship between the object to be exposed placed on the stage and an irradiated position of the electron beam with respect to the object to be exposed upon applying the second acceleration voltage to the acceleration electrode; and the calculation step of calculating a positional relationship between the object to be exposed and the position of the electron beam with respect to the object to be exposed upon applying the first acceleration voltage to the acceleration electrode, on the basis of the deviation detected in the deviation detection step, and the positional relationship detected in the positional relationship detection step.

According to another aspect of the present invention, the foregoing object is attained by providing a method of controlling an electron beam exposure apparatus for drawing a pattern on an object to be exposed by irradiating an electron beam onto the object to be exposed placed on a stage, comprising: the step of setting a first or second acceleration voltage in electron beam generation means for generating a first electron beam accelerated at the first acceleration voltage or a second electron beam accelerated at the second acceleration voltage higher than the first acceleration voltage; the deviation detection step of detecting a deviation between an irradiated position of the first electron beam with respect to the stage, and an irradiated position of the second electron beam with respect to the stage; the positional relationship detection step of detecting a positional relationship between the object to be exposed placed on the stage, and an irradiated position of the second electron beam with respect to the object to be exposed; and the calculation step of calculating a positional relationship between the object to be exposed, and an irradiated position of the first electron beam with respect to the object to be exposed, on the basis of the deviation detected in the deviation detection step, and the positional relationship detected in the positional relationship detection step.

The electron beam exposure apparatus is suitable for alignment between patterns.

The electron beam exposure apparatus is suitable for the manufacture of devices.

Further objects, features and advantages of the present invention will become apparent from the following detailed description of embodiments of the present invention with reference to the accompanying drawings.

BRIEF DESCRIPTION OF THE DRAWINGS

FIG. 6 is a block diagram for explaining the system arrangement according to the present invention;

FIG. 8 is a view for explaining alignment marks on a wafer;

FIGS. 15A and 15B are flow charts showing the flow of calibration; and

FIGS. 16A and 16B are flow charts showing the flow of exposure.

DETAILED DESCRIPTION OF THE PREFERRED EMBODIMENTS

[Explanation of Constituting Elements of Electron Beam Exposure Apparatus]

Figure 1:
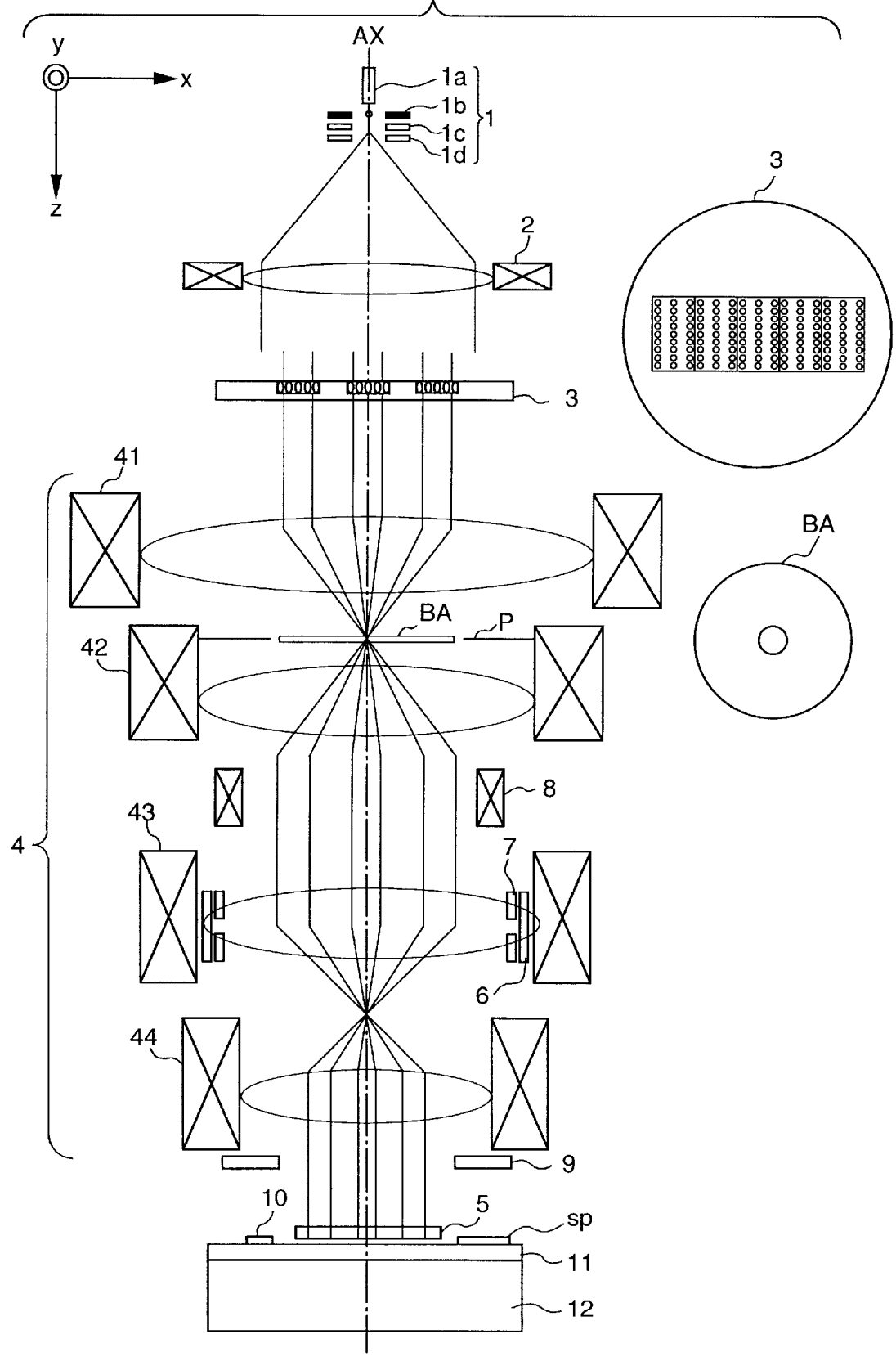
FIG. 1 is a schematic view showing principal part of an electron beam exposure apparatus according to the present invention.

FIG. 1 is a schematic view showing principal part of an electron beam exposure apparatus according to the present invention.

Referring to FIG. 1, reference numeral 1 denotes an electron gun made up of a cathode 1a, grid 1b, and first and second anodes 1c and 1d. Electrons emitted by the cathode 1a form a crossover image between the grid 1b and first anode 1c. The crossover image will be referred to as an electron source hereinafter.

Figure 2:
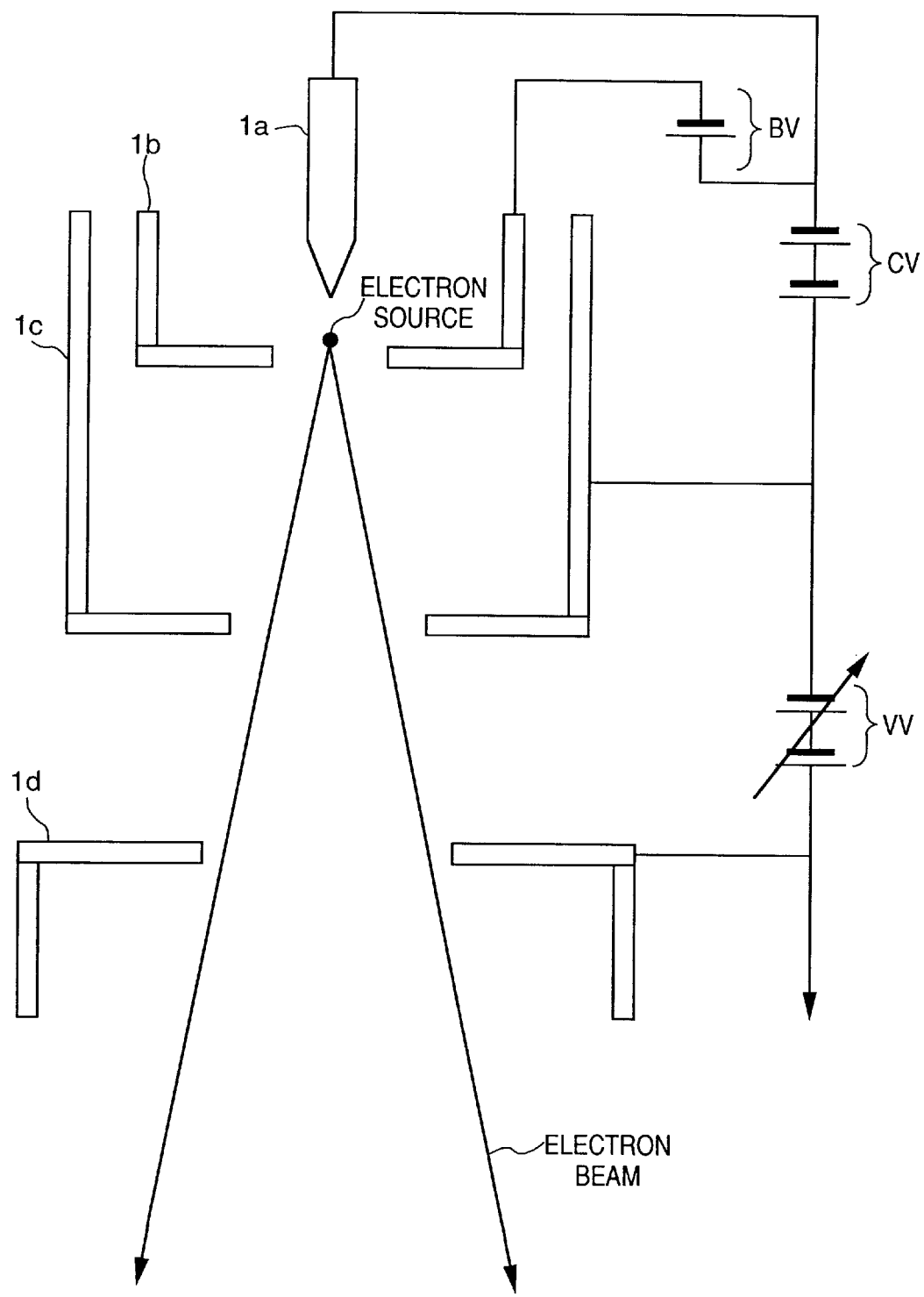
FIG. 2 is a view for explaining an electron gun according to the present invention.

FIG. 2 shows the electron gun 1 in detail. Reference symbol CV denotes a constant power supply for supplying a constant voltage; VV, a variable power supply that can vary a voltage; and BV, a bias power supply. The bias power supply BV applies, to the grid 1b, a bias potential which is negative with respect to the cathode 1a. The constant power supply CV applies, to the first anode 1c, a potential which is positive with respect to the cathode 1a. The variable power supply VV applies, to the second anode 1d, a potential which is positive with respect to the first anode 1c. By changing the voltage applied from the variable power supply, an electron beam is accelerated at an acceleration voltage of 10 kV in exposure, and at an acceleration voltage of 30 kV in alignment.

Referring back to FIG. 1, electrons coming from this electron source are converted into nearly collimated electron beams by a condenser lens 2 whose front-side focal point position is located at the electron source position. The nearly collimated electron beams enter an elementary electron optical system array 3. The elementary electron optical system array 3 is formed by arranging a plurality of elementary electron optical systems, each consisting of an aperture, electrostatic electron lens, and blanking electrode, in a direction perpendicular to an optical axis AX. The elementary electron optical system 3 will be explained in detail later.

The elementary electron optical system array 3 forms a plurality of intermediate images of the electron source. These intermediate images are projected in a reduced scale by a reduction electron optical system 4 (to be described later), and form images of the electron source on a wafer 5.

In this case, the individual elements of the elementary electron optical system array 3 are set so that the spacing between adjacent electron source images formed on the wafer 5 equals an integer multiple of the size of each electron source image. Furthermore, the elementary electron optical system array 3 makes the positions of the individual intermediate images differ in the optical axis direction in correspondence with the curvature of field of the reduction electron optical system 4, and corrects in advance any aberrations expected to be produced when the individual intermediate images are projected onto the wafer 5 in a reduced scale by the reduction electron optical system 4. Since the electron lens that makes up each elementary electron optical system is of electrostatic type, the aberrations of the elementary electron optical system itself become smaller in a region with a lower acceleration voltage (10 kV or less). Hence, exposure is preferably done in a region with a lower acceleration voltage (10 kV or less).

The reduction electron optical system 4 comprises a symmetric magnetic doublet consisting of a first projection lens 41 (43) and second projection lens 42 (44). If f1 represents the focal length of the first projection lens 41 (43), and f2 represents the focal length of the second projection lens 42 (44), the distance between these two lenses is f1+f2. The object point on the optical axis AX is located at the focal point position of the first projection lens 41 (43), and its image point is formed at the focal point of the second projection lens 42 (44). This image is reduced to –f2/f1. Since two lens magnetic fields are determined to act in opposite directions, the Seidel aberrations and chromatic aberrations associated with rotation and magnification theoretically cancel each other, except for five aberrations, i.e., spherical aberration, isotropic astigmatism, isotropic coma, curvature of field, and on-axis chromatic aberration.

Reference numeral 6 denotes a deflector for deflecting a plurality of electron beams coming from the elementary electron optical system array 3 to displace a plurality of electron source images by nearly equal displacement amounts in the X- and Y-directions on the wafer 5. The deflector 6 comprises a main deflector used when the deflection width is large, and a sub deflector used when the deflection width is small (neither are shown). The main deflector is an electromagnetic type deflector, and the sub deflector is an electrostatic type deflector.

Reference numeral 7 denotes a dynamic focus coil that corrects any deviations of the focus positions of the electron source images arising from deflection aberration produced upon operation of the deflector 6; and 8, a dynamic stigmatic coil that corrects astigmatism of deflection aberration produced upon deflection as in the dynamic focus coil 7.

Reference numeral 9 denotes a reflected electron detector for detecting reflected electrons or secondary electrons produced when the electron beams coming from the elementary electron optical system array 3 land on alignment marks formed on the wafer 5 or marks on a stage reference plate SP.

Reference numeral 10 denotes a Faraday cup having two single knife edges respectively extending in the X-and Y-directions. The Faraday cup detects the charge amount of images formed by the electron beams coming from the elementary electron optical system.

Reference numeral 11 denotes a θ-Z stage that carries a wafer, and is movable in the direction of the optical axis AX (Z-axis) and in the direction of rotation about the Z-axis. The above-mentioned stage reference plate SP and Faraday cup 10 are fixed on the stage 11.

Reference numeral 12 denotes an X-Y stage which carries the θ-Z stage and is movable in the X- and Y-directions perpendicular to the direction of the optical axis AX (Z-axis).

Figure 3:
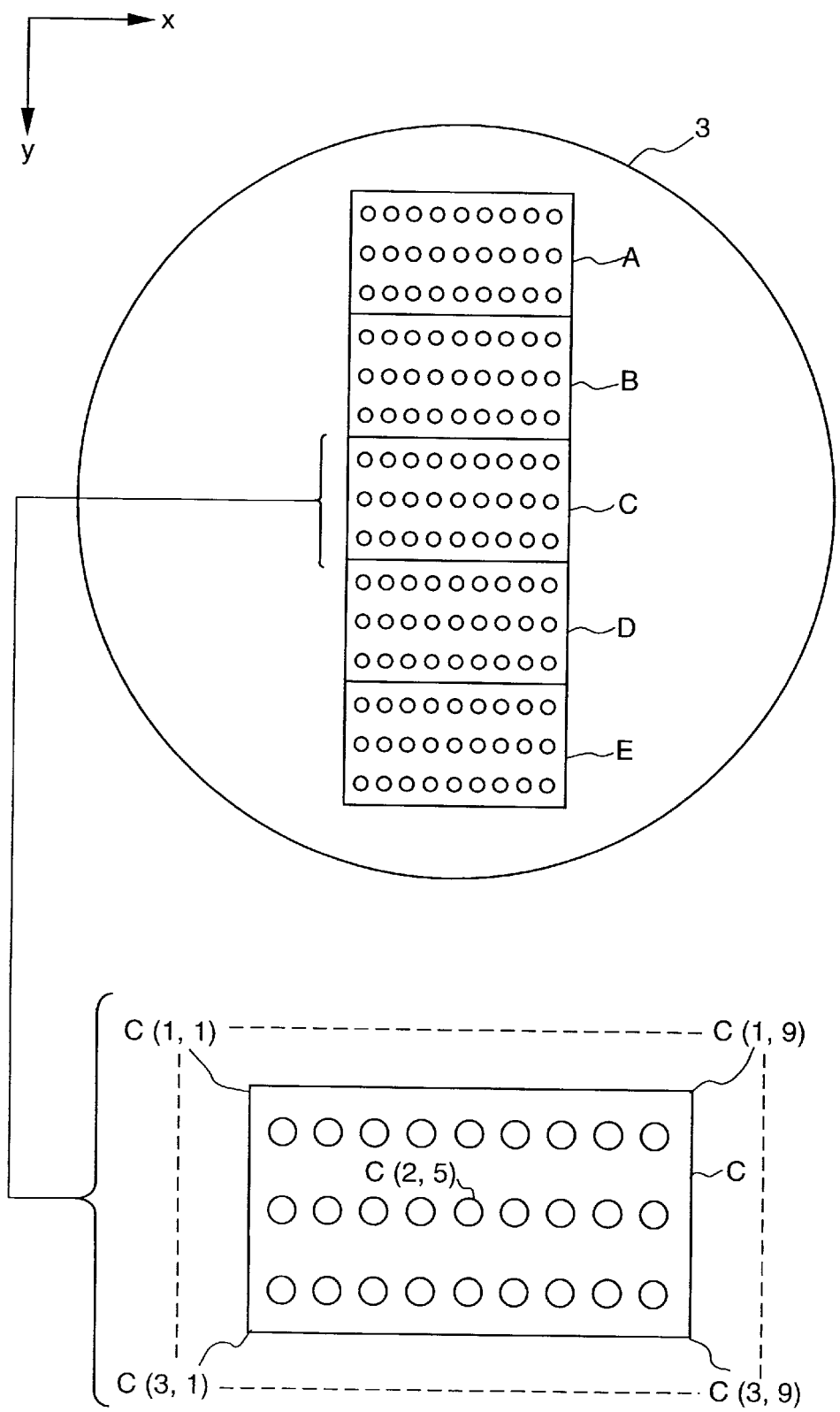
FIG. 3 is a view for explaining an elementary electron optical system array 3.

The elementary electron optical system array 3 will be explained below with reference to FIG. 3.

In the elementary electron optical system array 3, a plurality of elementary electron optical systems form a group (subarray), and a plurality of subarrays are formed. In this embodiment, five subarrays A to E are formed. In each subarray, a plurality of elementary electron optical systems are two-dimensionally arranged, and 27 elementary electron optical systems (e.g., C(1,1) to C (3,9)) are formed in each subarray of this embodiment.

Figure 4:
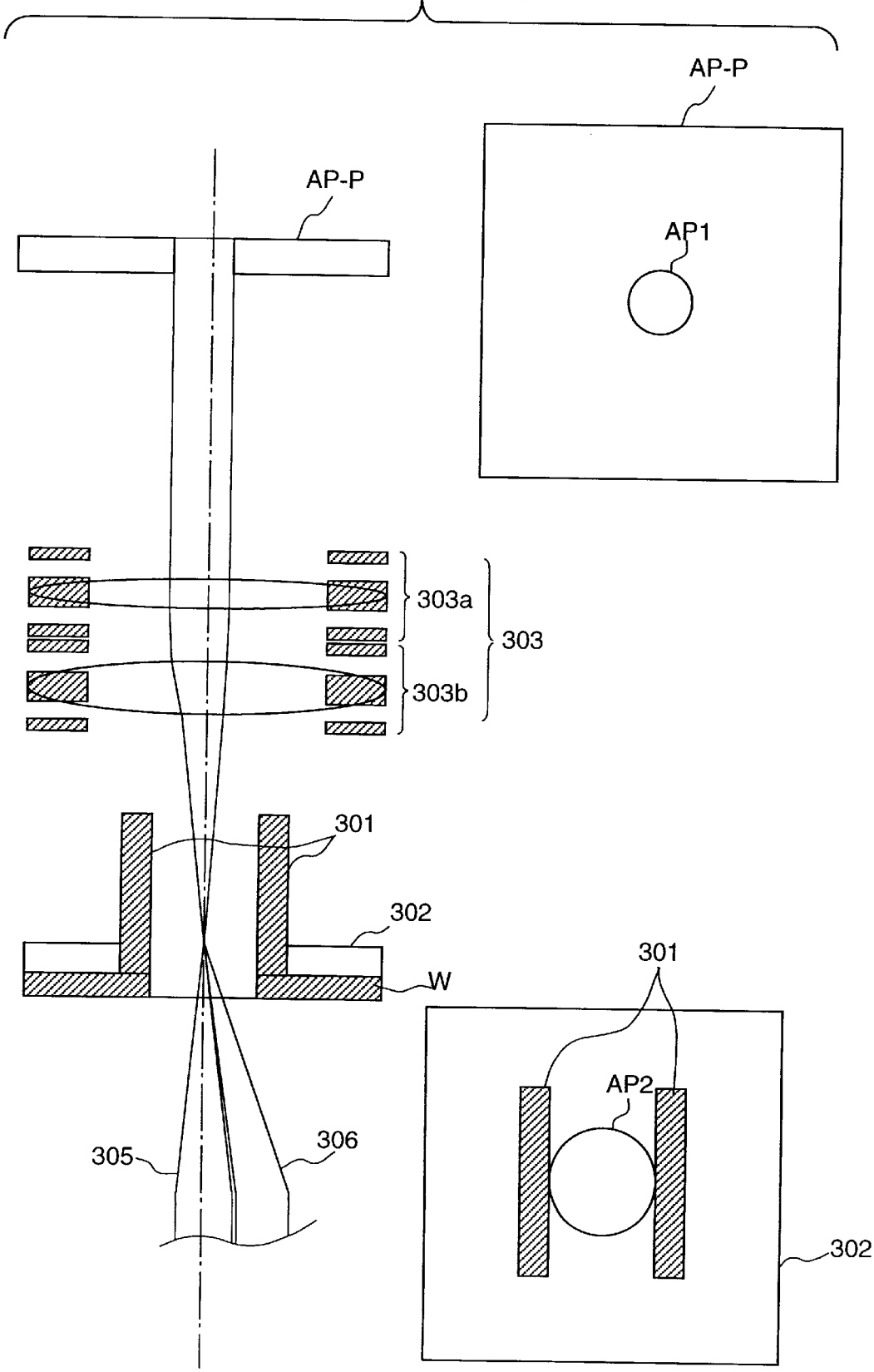
FIG. 4 is a view for explaining an elementary electron optical system.

FIG. 4 is a sectional view of each elementary electron optical system.

Referring to FIG. 4, a substrate AP-P is irradiated with electron beams nearly collimated by the condenser lens 2. The substrate AP-P has an aperture (AP1) that defines the shape of electron beams to be transmitted, and is common to other elementary electron optical systems. That is, the substrate AP-P has a plurality of apertures in correspondence with the elementary electron optical systems.

Reference numeral 301 denotes a blanking electrode which is made up of a pair of electrodes and has a deflection function; and 302, a substrate which has an aperture (AP2) which is larger than the aperture (AP1) and is common to other elementary electron optical systems. On the substrate 302, the blanking electrode 301 and a wiring layer (W) for turning on/off the electrodes are formed. That is, the substrate 302 has a plurality of apertures and a plurality of blanking electrodes.

Reference numeral 303 denotes an electron optical system, which uses two unipotential lenses 303a and 303b. Each unipotential lens is made up of three aperture electrodes, and has a convergence function by setting the upper and lower electrodes at the same potential as an acceleration potential V0, and keeping the intermediate electrode at another potential V1 or V2. The individual aperture electrodes are stacked on a substrate via insulating materials, and that substrate is common to other elementary electron optical systems. That is, the substrate has a plurality of electron optical systems 303.

Figure 5A:
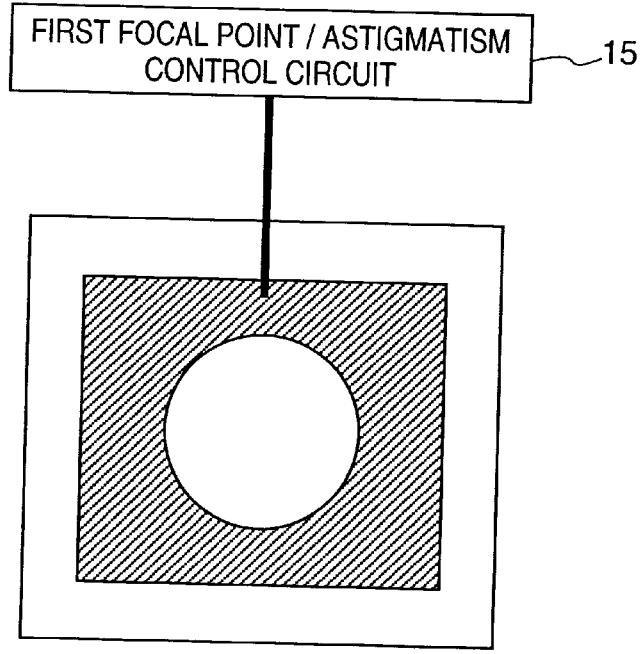
FIGS. 5A and 5B are views for explaining an elementary electron optical system.

The upper, intermediate, and lower electrodes of the unipotential lens 303a and the upper and lower electrodes of the unipotential lens 303b have a shape shown in FIG. 5A, and the upper and lower electrodes of the unipotential lenses 303a and 303b are set at common potential in all the elementary electron optical systems by a first focal point/astigmatism control circuit 15 (to be described later).

Since the potential of the intermediate electrode of the unipotential lens 303a can be set by the first focal point/astigmatism control circuit 15 in units of elementary electron optical systems, the focal length of the unipotential lens 303a can be set in units of elementary electron optical systems.

Figure 5B:
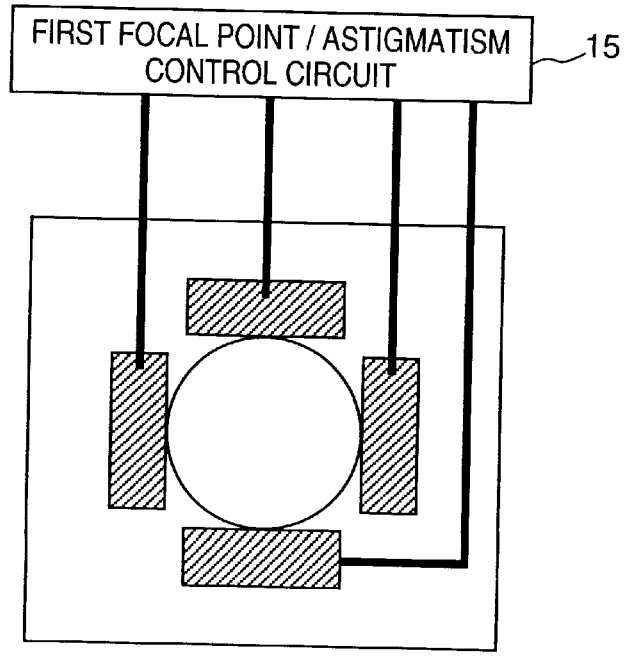

The intermediate electrode of the unipotential lens 303b is made up of four electrodes, as shown in FIG. 5B, and the potentials of these electrodes can be set independently and also individually in units of elementary electron optical systems by the first focal point/astigmatism control circuit 15. Hence, the unipotential lens 303b can have different focal lengths in a section perpendicular to its optical axis and can set them individually in units of elementary electron optical systems.

As a consequence, by respectively controlling the potentials of the intermediate electrodes of the electron optical systems 303, the electron optical characteristics (the intermediate image forming positions and astigmatism) of the elementary electron optical systems can be controlled.

Each nearly collimated electron beam output from the condenser lens 2 forms an intermediate image of the electron source via the aperture (AP1) and electron optical system 303. Note that the aperture (AP1) is located at or in the vicinity of the front-side focal point position of the corresponding electron optical system 303, and the blanking electrode 301 is located at or in the vicinity of the intermediate image forming position of the corresponding electron optical system 303. For this reason, if no electric field is applied across the electrodes of the blanking electrode 301, the electron beam is not deflected, as indicated by an electron beam 305 in FIG. 4. On the other hand, if an electric field is applied across the electrodes of the blanking electrode 301, the electron beam is deflected, as indicated by an electron beam 306 in FIG. 4. Since the electron beams 305 and 306 have different angle distributions on the object plane of the reduction electron optical system 4, they become incident on different regions at the pupil position (on a plane P in FIG. 1) of the reduction electron optical system 4. Hence, a blanking aperture BA that transmits the electron beam 305 alone is formed at the pupil position (on the plane P in FIG. 1) of the reduction electron optical system.

The electron optical systems 303 of the elementary electron optical systems individually set the potentials of their two intermediate electrodes so as to correct curvature of field and astigmatism produced when the intermediate images formed thereby are projected in a reduced scale onto the surface to be exposed by the reduction electron optical system 4, thereby making the electron optical characteristics (intermediate image forming positions and astigmatism) the elementary electron optical systems different. However, in this embodiment, in order to decrease the number of wiring lines between the intermediate electrodes and the first focal point/astigmatism control circuit 15, the elementary electron optical systems included in a single subarray have identical electron optical characteristics, and the electron optical characteristics (intermediate image forming positions and astigmatism) of the elementary electron optical systems are controlled in units of subarrays.

Furthermore, in order to correct distortion produced when a plurality of intermediate images are projected in a reduced scale onto the surface to be exposed by the reduction electron optical system 4, the distortion characteristics of the reduction electron optical system 4 are detected in advance, and the positions of the elementary electron optical systems in the direction perpendicular to the optical axis of the reduction electron optical system 4 are set based on the detected characteristics.

FIG. 6 shows the system arrangement of this embodiment.

An acceleration voltage control circuit 13 changes the acceleration voltage of electron beams between the exposure mode and alignment mode, and a CL optical characteristic control circuit CLC adjusts the optical characteristics of the condenser lens 2 by changing the excitation currents of electromagnetic lenses that make up the condenser lens 2. A blanking control circuit 14 individually ON/OFF-controls the blanking electrodes of the elementary electron optical systems in the elementary electron optical system array 3, and the first focal point/astigmatism control circuit 15 individually controls the electron optical characteristics (intermediate image forming positions and astigmatism) of the elementary electron optical systems in the elementary electron optical system array 3.

A second focal point/astigmatism control circuit 16 controls the focal point position and astigmatism of the reduction electron optical system 4 by controlling the dynamic stigmatic coil 8 and dynamic focus coil 7. A deflection control circuit 17 controls the deflector 6. A magnification adjustment circuit 18 adjusts the magnification of the reduction electron optical system 4. An optical characteristic adjustment circuit 19 adjusts rotation aberration and optical axis by changing the excitation currents of electromagnetic lenses that make up the reduction electron optical system 4.

A stage drive control circuit 20 controls driving of the θ-Z stage, and also controls driving of the X-Y stage 12 in collaboration with a laser interferometer 21 that detects the position of the X-Y stage 12.

A control system 22 synchronously controls the plurality of control circuits described above, reflected electron detector 9, and Faraday cup 10 to attain exposure and alignment based on data from a memory 23 that stores information associated with the pattern to be drawn. The control system 22 is controlled by a CPU 25 for controlling the entire electron beam exposure apparatus via an interface 24.

[Explanation of Operation]

Figure 7A:
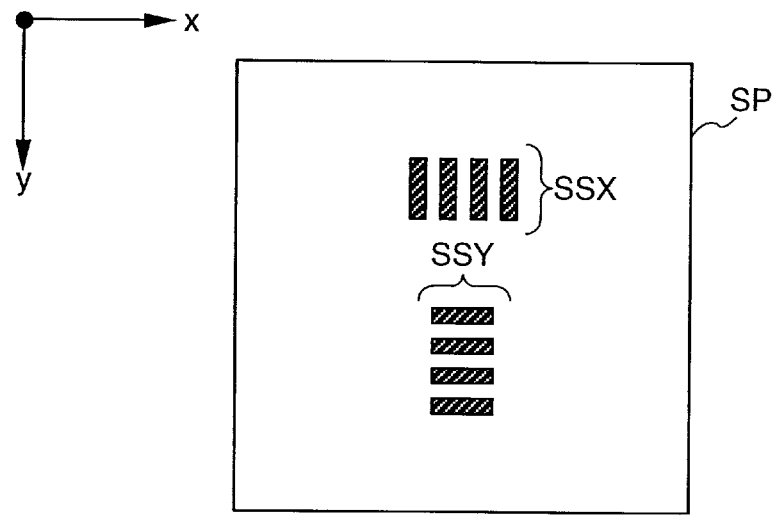
FIGS. 7A and 7B are views for explaining reference position marks on a stage reference plate.

As shown in FIG. 7A, an X-direction reference position mark SSX and Y-direction reference position mark SSY are formed on the stage reference plate SP. Each mark is a lattice-like mark defined by linear marks arranged at a pitch Pm ($\mu$m) in the corresponding measurement direction.

The operation of the electron beam exposure apparatus according to the preferred embodiment of the present invention will be explained below with reference to FIG. 6, FIGS. 15A and 15B, and FIGS. 16A and 16B.

Calibration in this electron beam exposure apparatus will first be explained with reference to FIG. 6 and FIGS. 15A and 15B. Calibration is started when the CPU 25 issues a calibration command to the control system 22 via the interface 24.

In step S101, the control system 22 controls the acceleration voltage control circuit 13 to set the acceleration voltage of electron beams emitted by the electron gun 1 at 10 kV.

In step S102, the control system 22 directs the stage drive control circuit 20 to move the X-Y stage 12, so that the central position of the mark SSX used to check the X-position on the stage reference plate SP roughly matches a designed beam reference position. Note that the beam reference position is defined by the irradiated position, on the wafer, of a non-deflected electron beam coming from a specific elementary optical system (in this case, the central elementary electron optical system C(2,5)) in the elementary electron optical system array 3 shown in FIG. 3.

Figure 7B:
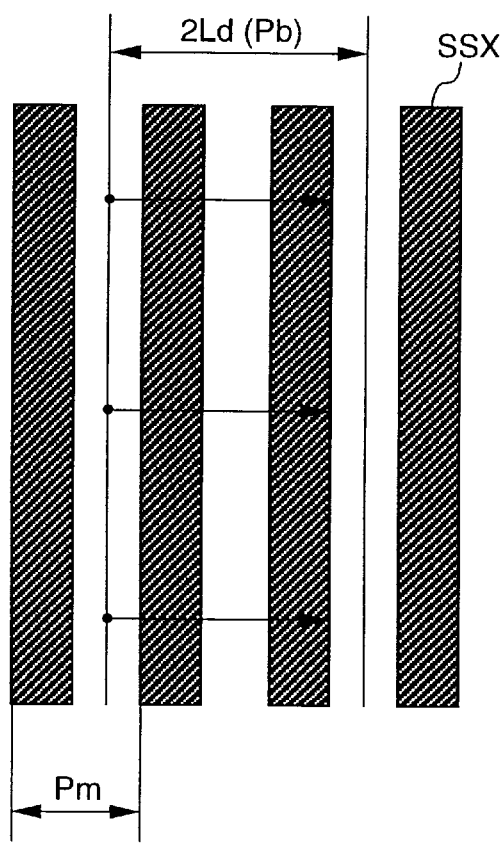

In step S103, the control system 22 directs the blanking control circuit 14 to turn off the blanking electrodes corresponding to the elementary electron optical systems C(1,5), C(2,5), and C(3,5) and to keep other blanking electrodes ON, so that three electron beams alone coming from the elementary electron optical systems C(1,5), C(2,5), and C(3,5) having an identical position in the measurement direction (X-direction) land on the θ-Z stage 11. Also, as shown in FIG. 7B, the control system 22 instructs the deflection control circuit 17 to displace (scan) these selected electron beams on the lattice-like pattern SSX in a region ±Ld ($\mu$m) having the beam reference position for the X-coordinate as the center, and instructs the reflected electron detector 9 to synthesize reflected electrons or secondary electrons coming from the lattice-like pattern produced in correspondence with these electron beams and to simultaneously detect them. The control system 22 then stores a discrete signal sequence (alignment signal) as a signal representing the relationship between the displacement amount of the electron beams and the detected electron amount in the memory 23. Note that a sampling interval Ls ($\mu$m) of the discrete electric signals is determined by the resolution of the deflector 6, and the scanning region is set to satisfy 2Ld=M×Pm (M is a positive integer) and 2Ld=N×Ls (N is a positive integer, M<N).

In step S104, the control system 22 transforms the obtained discrete electric signal sequence S(x) into a signal in the spatial frequency domain by discrete Fourier transformation to calculate the Fourier coefficients of frequency (1/Pm) determined by the pitch of the lattice-like mark.

The calculation method is known to those who are skilled in the art. When the sampling frequency 1/2Ld is normalized to 1, since 1/Pm=M/2Ld holds, as described above, the spatial frequency of a periodic signal determined by the pitch of the lattice-like mark is M, and a complex Fourier coefficient X(M) of that spatial frequency M is given by:

$$X(M) = \Sigma S(n \times Ls) e^{-j2\pi(M/N)(n \times Ls)}$$

(where j is the imaginary number unit.)

The strength E(M) and phase Θ(M) of the periodic signal at that time are respectively given by:

$$E(M)=((Re(X(M))^2+(Im(X(M))^2)$$

$$\Theta(M)=\tan^{-1}(IM(X(M))/(Re(X(M)))$$

(where Re(X(M)) and Im(X(M)) are respectively the real and imaginary parts of a complex number X(k).)

Using the phase Θ(M) of the periodic signal of frequency 1/Pm obtained by the above-mentioned method, a deviation DX10 in the X-direction between the central position (designed beam reference position) of the lattice-like mark SSX and the irradiated position (actual beam reference position) of an electron beam coming from the elementary electron optical system C(2,5) when acceleration voltage =10 kV is calculated by:

$$DX10=Pm\times(\Theta(M)/2\pi)$$

In step S105, the control system 22 controls the acceleration voltage control circuit 13 to set the acceleration voltage of electron beams emitted by the electron gun 1 at 30 kV. Furthermore, the control system 22 controls the CL optical characteristic control circuit CLC to adjust the optical characteristics of the condenser lens 2, controls the first focal point/astigmatism control circuit 15 to adjust the optical characteristics of the elementary electron optical systems C(1,5), C(2,5), and C(3,5), and controls the optical characteristic adjustment circuit 19 to adjust the optical characteristics of the reduction electron optical system 4, so that electron beams transmitted through the elementary electron optical systems C(1,5), C(2,5), and C(3,5) having an identical position in the measurement direction (X-direction) form electron source images on the stage reference plate SP.

In step S106, the control circuit 22 directs the reflected electron detector 9 to detect reflected electrons or secondary electrons coming from the lattice-like pattern SSX while displacing (scanning) the electron beams from the elementary electron optical systems C(1,5), C(2,5), and C(3,5) on the lattice-like pattern SSX in the region ±Ld (µm) having the beam reference position as the center, and stores a discrete signal sequence (alignment signal) as the detection signal of the detector 9 in the memory 23, by the same processing as in step S103.

In step S107, the control system 22 calculates Θ(M) on the basis of the discrete signal sequence stored in the memory 23 in step S106 in the same manner as in step S104. The control system 22 then calculates a deviation DX30 in the X-direction between the central position of the lattice-like mark SSX and the beam reference position of an electron beam coming from the elementary electron optical system C(2,5) when acceleration voltage =30 kV by:

$$DX30=Pm\times(\Theta)(M)/2\pi)$$

In step S108, the control system 22 calculates a difference DDX between the X-direction beam reference position of the electron beam coming from the elementary electron optical system C(2,5) when acceleration voltage =10 kV and that when acceleration voltage =30 kV using the following equation:

$$DDX=DX30-DX10$$

In steps S109 to S116, the control system 22 executes the same processing as in steps S101 to S108 for the lattice-like mark SSY to check the Y-position, and calculates a difference DDY between the Y-direction beam reference position of the electron beam coming from the elementary electron optical system C(2,5) when acceleration voltage =10 kV and that when acceleration voltage =30 kV.

More specifically, in step S109, the control system 22 controls the acceleration voltage control circuit 13 to set the acceleration voltage of electron beams emitted by the electron gun 1 at 10 kV.

In step S110, the control system 22 directs the stage drive control circuit 20 to move the X-Y stage 12, so that the central position of the mark SSY used to check the Y-position on the stage reference plate SP roughly matches a designed beam reference position.

In step S111, the control system 22 directs the blanking control circuit 14 to turn off the blanking electrodes corresponding to the elementary electron optical systems C(2,4), C(2,5), and C(2,6) and to keep other blanking electrodes ON, so that three electron beams alone coming from the elementary electron optical systems C(2,4), C(2,5), and C(2,6) having an identical position in the measurement direction (Y-direction) land on the θ-Z stage 11. Also, the control system 22 instructs the deflection control circuit 17 to displace (scan) these selected electron beams on the lattice-like pattern SSY in the region ±Ld (µm) to have the beam reference position for the Y-coordinate as the center, and instructs the reflected electron detector 9 to synthesize reflected electrons or secondary electrons coming from the lattice-like pattern produced in correspondence with these electron beams and to simultaneously detect them. The control system 22 then stores a discrete signal sequence (alignment signal) as a signal representing the relationship between the displacement amount of the electron beams and the detected electron amount in the memory 23.

In step S112, the control system 22 calculates Θ(M) on the basis of the discrete signal sequence stored in the memory 23 in step Sill by the same processing as in step S104. The control system 22 then calculates a deviation DY10 in the Y-direction between the central position of the lattice-like mark SSY and the beam reference position of an electron beam coming from the elementary electron optical system C(2,5) when acceleration voltage =10 kV by:

$$DY10=Pm\times(\Theta(M)/2\pi)$$

In step S113, the control system 22 controls the acceleration voltage control circuit 13 to set the acceleration voltage of electron beams emitted by the electron gun 1 at 30 kV. Furthermore, the control system 22 controls the CL optical characteristic control circuit CLC to adjust the optical characteristics of the condenser lens 2, controls the first focal point/astigmatism control circuit 15 to adjust the optical characteristics of the elementary electron optical systems C(2,4), C(2,5), and C(2,6), and controls the optical characteristic adjustment circuit 19 to adjust the optical characteristics of the reduction electron optical system 4, so that electron beams transmitted through the elementary electron optical systems C(2,4), C(2,5), and C(2,6) having an identical position in the measurement direction (Y-direction) form electron source images on the stage reference plate SP.

In step S114, the control circuit 22 directs the reflected electron detector 9 to detect reflected electrons or secondary electrons coming from the lattice-like pattern SSY while displacing (scanning) the electron beams from the elementary electron optical systems C(2,4), C(2,5), and C(2,6) on the lattice-like pattern SSY in the region ±Ld (µm) to have the beam reference position as the center, and stores a discrete signal sequence (alignment signal) as the detection signal of the detector 9 in the memory 23, by the same processing as in step S111.

In step S115, the control system 22 calculates Θ(M) on the basis of the discrete signal sequence stored in the memory 23 in step S114 in the same manner as in step S112. The control system 22 then calculates a deviation DY30 in the Y-direction between the central position of the lattice-like mark SSY and the beam reference position of an electron beam coming from the elementary electron optical system C(2,5) when acceleration voltage =30 kV by:

$$DY30 = Pm \times (\Theta(M)/2\pi)$$

In step S116, the control system 22 calculates a difference DDY between the Y-direction beam reference position of the electron beam coming from the elementary electron optical system C(2,5) when acceleration voltage =10 kV and that when acceleration voltage =30 kV using the following equation:

$$DDY = DY30 - DY10$$

Next, exposure done after execution of the above-mentioned calibration will be explained below.

In overlap exposure, a plurality of rectangular pattern regions CP are formed in a matrix on the wafer 5, as shown in FIG. 8. On pattern regions CP(1) to CP(9), patterns that form the underlying layer of a layer on which the pattern is to be drawn in the exposure process have already been formed in the previous process. An alignment mark SX in the X-direction, alignment mark SY1 in the Y-direction, and alignment mark SY2 in the direction of rotation in the X-Y plane are formed around each pattern region CP. These alignment marks are lattice-like marks each defined by linear marks arranged at the pitch Pm ($\mu$m) in the same measurement direction as that (X- or Y-direction) of the corresponding mark formed on the stage reference plate SP.

Exposure is done when the CPU 25 issues an exposure execution command to the control system 22 via the interface 24. The flow of exposure will be explained below with reference to FIG. 6 and FIGS. 16A and 16B.

In step S201, the control system 22 controls the acceleration voltage control circuit 13 to set the acceleration voltage of electron beams emitted by the electron gun 1 at 30 kV. Furthermore, the control system 22 controls the CL optical characteristic control circuit CLC to adjust the optical characteristics of the condenser lens 2, controls the first focal point/astigmatism control circuit 15 to adjust the optical characteristics of the elementary electron optical systems C(1,5), C(2,5), and C(3,5), and controls the optical characteristic adjustment circuit 19 to adjust the optical characteristics of the reduction electron optical system 4, so that electron beams transmitted through the elementary electron optical systems C(1,5), C(2,5), and C(3,5) having an identical position in the X-direction form electron source images on the wafer 5.

In steps S202 to S207, the control system 22 inspects the positional relationship between the actual beam reference position and designed beam reference position of each pattern region.

More specifically, in step S202, the control system 22 initializes a parameter i indicating the number of the pattern region to be inspected to "1".

In step S203, the control system 22 directs the stage drive control circuit 20 to move the X-Y stage 12 so that the central position of the mark SX of a pattern region CP(i) matches the designed beam reference position. Note that the beam reference position in this example is the irradiated position, on the wafer, of a non-deflected electron beam coming from the elementary electron optical system C(2,5).

Subsequently, the control system 22 detects any deviation of the mark SX of the pattern region CP(i) from the beam reference position in the X-direction by the method in steps S103 and 104.

In step S204, the control system 22 directs the stage drive control circuit 20 to move the X-Y stage 12 so that the central position of the mark SY1 of the pattern region CP(i) matches the designed beam reference position. The control system 22 then detects any deviation of the mark SY1 of the pattern region CP(i) from the beam reference position in the Y-direction by the method in steps S103 and 104.

In step S205, the control system 22 directs the stage drive control circuit 20 to move the X-Y stage 12 so that the central position of the mark SY2 of the pattern region CP(i) matches the designed beam reference position. The control system 22 then detects any deviation of the mark SY2 of the pattern region CP(i) from the beam reference position in the Y-direction by the method in steps S103 and 104.

In step S206, the control system 22 checks if the parameter i is 9, i.e., if the processing in steps S203 to S205 has been done for all the pattern regions. If i <9, the control system 22 increments i by 1 in step S207, and the flow returns to step S203.

In step S208, the control system 22 generates positional relationship data indicating the positional relationship between the position of a pattern in each of the pattern regions CP(1) to CP(9) and the beam reference position at an acceleration voltage of 30 kV, i.e., the irradiated position of the electron beam on the wafer 5 at an acceleration voltage of 30 kV, on the basis of the positional relationship among the lattice-like marks SX, SY1, and SY2, and the beam reference position detected in steps S202 to S207.

Figure 15A:
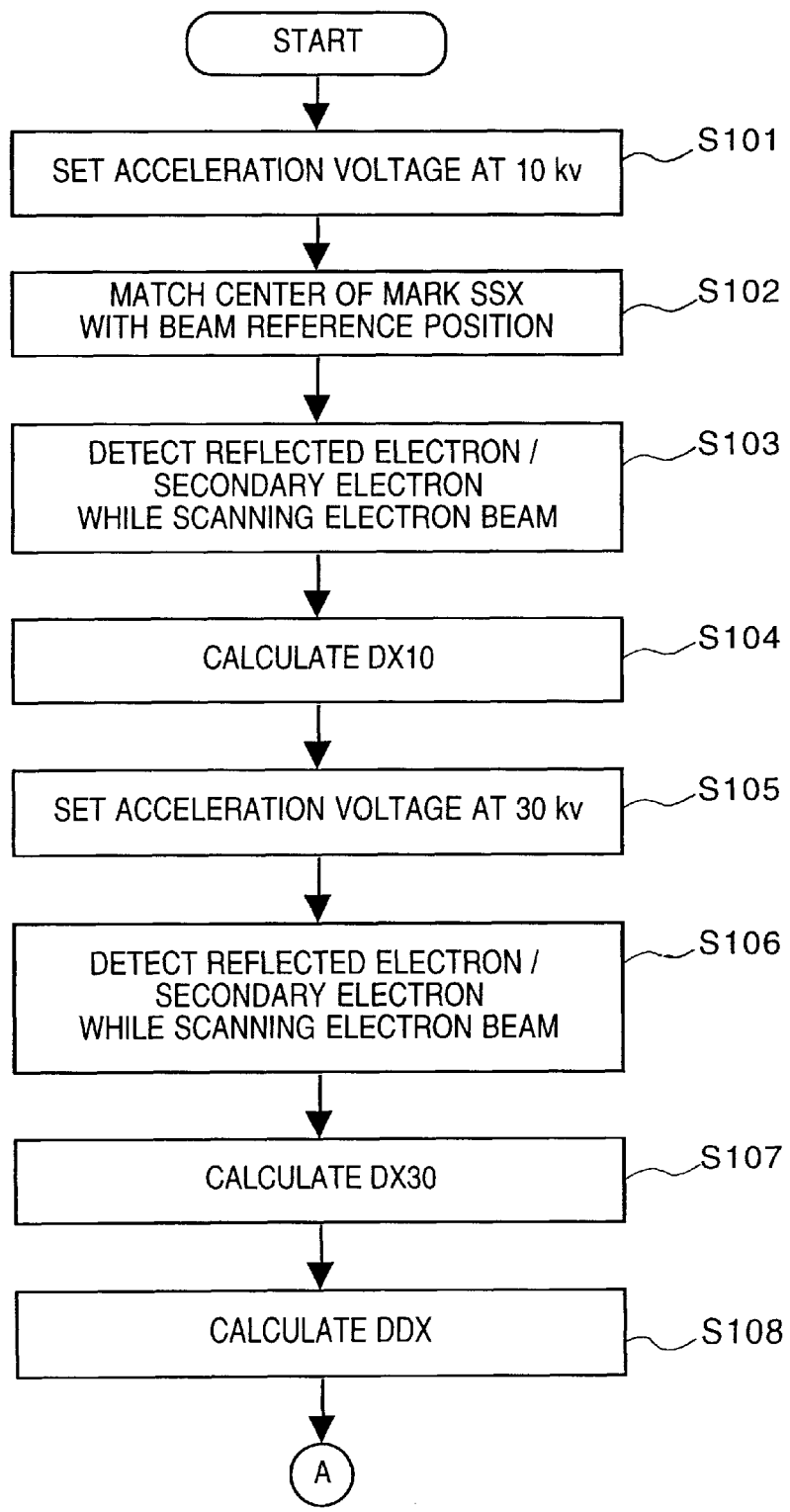
Figure 16B:
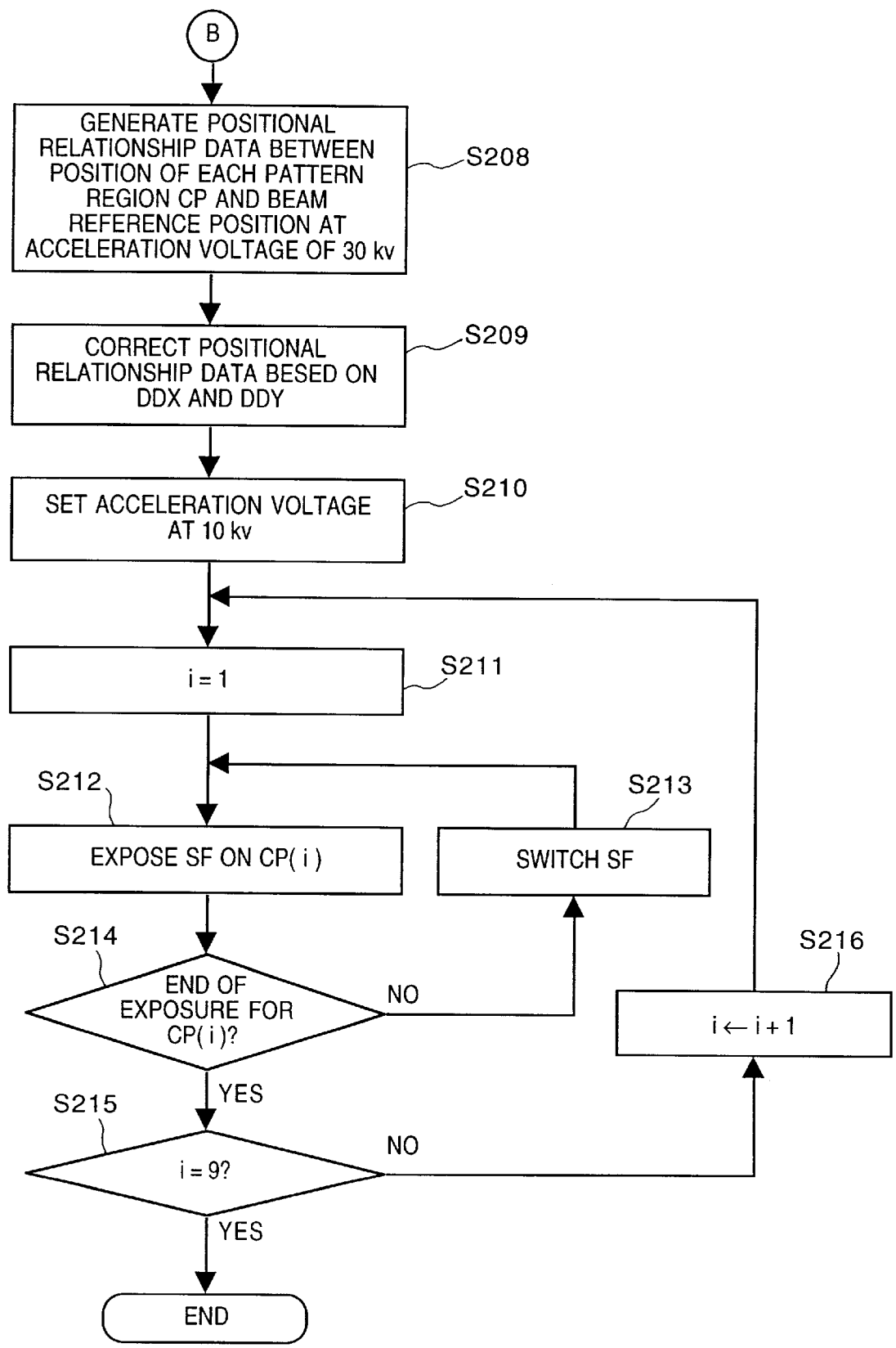

In step S209, the control system 22 corrects the positional relationship data on the basis of the differences DDX and DDY between the beam reference position at an acceleration voltage of 30 kV and that at an acceleration voltage of 10 kV, which are calculated in the calibration shown in FIGS. 15A and 15B. With this correction, the control system 22 generates corrected positional relationship data indicating the positional relationship between the pattern in each pattern region and the beam reference position at an acceleration voltage of 10 kV, i.e., the irradiated position of the electron beam on the wafer 5 at an acceleration voltage of 10 kV, and stores it in the memory 23.

In step S210, the control system 22 controls the acceleration voltage control circuit 13 to set the acceleration voltage of electron beams emitted by the electron gun 1 at 10 kV. Also, the control system 22 controls the CL optical characteristic control circuit CLC to adjust the optical characteristics of the condenser lens 2, controls the first focal point/astigmatism control circuit 15 to adjust the optical characteristics of the elementary electron optical system array 3, and controls the optical characteristic adjustment circuit 19 to adjust the optical characteristics of the reduction electron optical system 4.

In steps S211 to S216, the control system 22 controls exposure on the wafer while controlling the stage drive control circuit 20 on the basis of the corrected positional relationship data.

In step S211, the control system 22 initializes a parameter i indicating the number of the pattern region to be exposed to "1".

In step S212, the control system 22 controls the stage drive control circuit 22 to adjust the position of the wafer 5 (to align the wafer 5 and the irradiated position of the electron beam) on the basis of the corrected positional relationship data, so that the beam reference position of electron beams coming from the elementary electron optical system array 3 is located at a predetermined position (start point) on a pattern region CP(i).

The control system 22 then makes the deflection control circuit 17 deflect a plurality of electron beams coming from the elementary electron optical system 3 by the sub deflector of the deflector 6, and makes the blanking control circuit 14 turn on/off the blanking electrodes of the elementary electron optical systems in accordance with the pattern to be exposed on the wafer 5. At this time, the X-Y stage 12 is continuously moving in the X- or Y-direction, and the deflection control circuit 17 controls the deflection position of each electron beam in consideration of the moving amount of the X-Y stage 12.

Figure 9A:
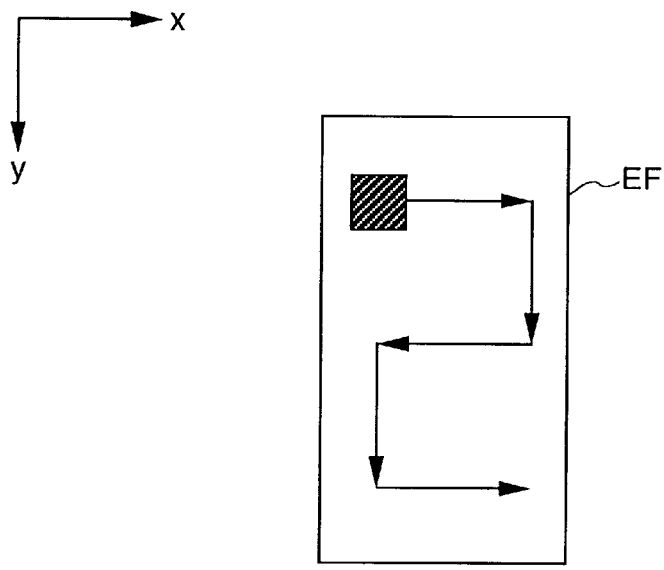
FIGS. 9A and 9B are views for explaining an exposure field (EF) and subarray exposure field (SEF)
Figure 9B:
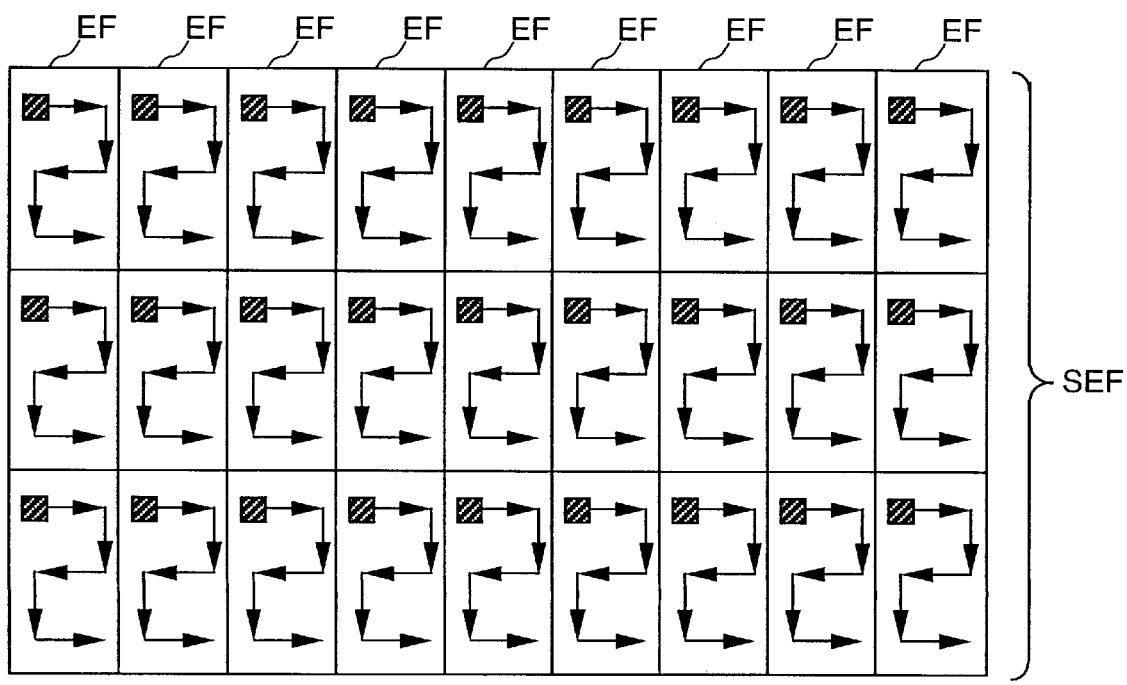

With this control, an electron beam from one elementary electron optical system scans and exposes an exposure field (EF) on the wafer 5 to have a full square as the start point, as shown in FIG. 9A. On the other hand, a plurality of electron beams coming from a single subarray expose a subarray exposure field (SEF) including a plurality of exposure fields (EFs) of the respective elementary electron optical systems, as shown in FIG. 9B.

Figure 10A:
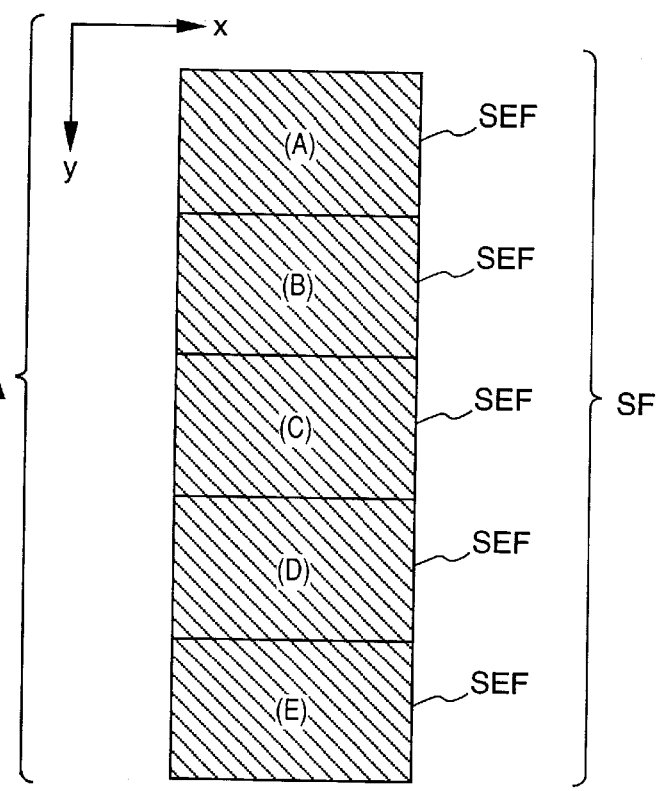
FIGS. 10A and 10B are views for explaining the subarray exposure field (SEF) and subfield.

Accordingly, when the processing in step S212 is executed once, a subfield (SF) made up of a plurality of subarray exposure fields (SEF(A) to SEF(E)) is exposed, as shown in, e.g., FIG. 10A.

In step S214, the control system 22 checks if exposure of all the areas in the pattern region CP(i) is complete. If NO in step S214, the flow advances to step S213; otherwise, the flow advances to step S215.

Figure 10B:
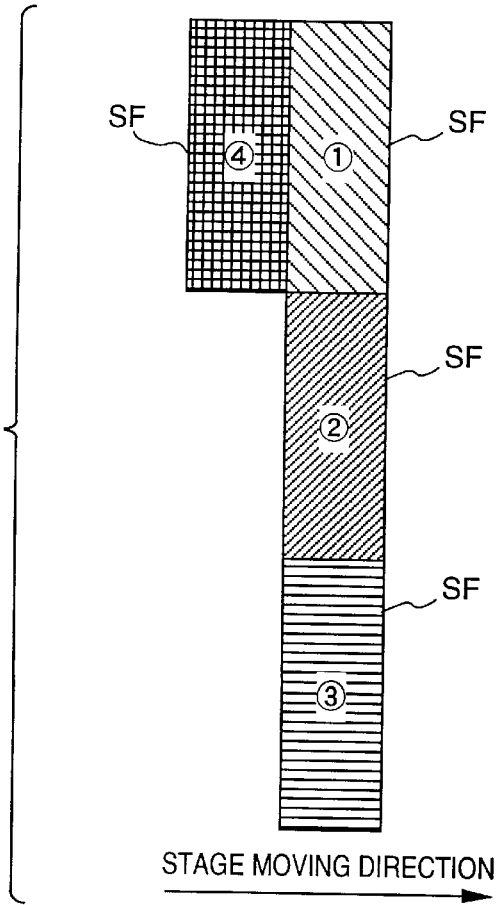

In step S213, the control system 22 changes the subfield to be exposed. This change is done in the order of $\hat{1} \rightarrow \hat{2} \rightarrow \hat{3} \rightarrow \hat{4} \rightarrow, \ldots$, as shown in, e.g., FIG. 10B. More specifically, the control system 22 directs the deflection control circuit 17 to deflect the plurality of electron beams coming from the elementary electron optical system array 3 using the main deflector of the deflector 6, so that the irradiated position of the plurality of electron beams changes from one subfield (e.g., $\hat{1}$) to the next subfield (e.g., $\hat{2}$). In this case, the control system 22 directs the second focal point/astigmatism control circuit 16 to control the dynamic focus coil 7 on the basis of predetermined dynamic focal point correction data so as to correct the focal position of the reduction electron optical system 4, and to control the dynamic stigmatic coil 8 on the basis of predetermined astigmatism correction data so as to correct the astigmatism of the reduction electron optical system 4.

In step S215, the control system 22 checks if exposure for all the pattern regions CP(1) to CP(9) is complete. If NO in step S215, the control system 22 increments the parameter i by 1 in step S216 (to change the pattern region to be exposed), and the flow returns to step S211.

An embodiment of a method of manufacturing a device using the above-mentioned electron beam exposure apparatus and exposure method will be explained below.

Figure 11:
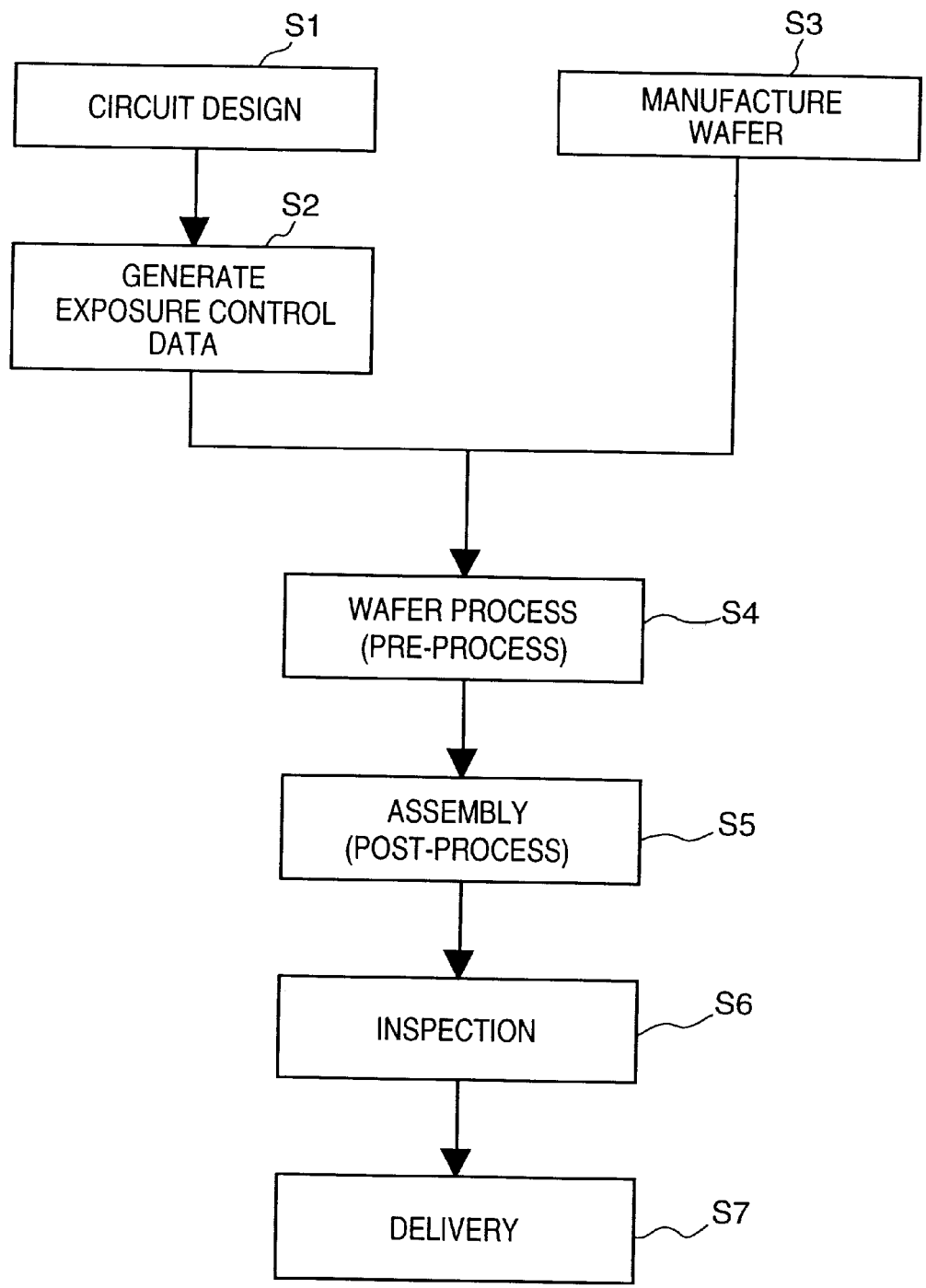
FIG. 11 is a flow chart for explaining the manufacturing flow of a microdevice.

FIG. 11 shows the flow in the manufacture of a microdevice (semiconductor chips such as ICs, LSIs, liquid crystal devices, CCDs, thin film magnetic heads, micromachines, and the like). In step 1 (circuit design), the circuit design of a semiconductor device is done. In step 2 (generate exposure control data), the exposure control data of the exposure apparatus is generated based on the designed circuit pattern. Separately, in step 3 (manufacture wafer), a wafer is manufactured using materials such as silicon and the like. Step 4 (wafer process) is called a pre-process, and an actual circuit is formed by lithography on the wafer using the exposure apparatus input with the prepared exposure control data, and the manufactured wafer. The next step (assembly) is called a post-process, in which semiconductor chips are assembled using the wafer obtained in step 4, and includes an assembly process (dicing, bonding), a packaging process (encapsulating chips), and the like. In step 6 (inspection), inspections such as operation tests, durability tests, and the like of semiconductor devices assembled in step 5 are conducted. Semiconductor devices are completed via these processes, and are delivered (step 7).

Figure 12:
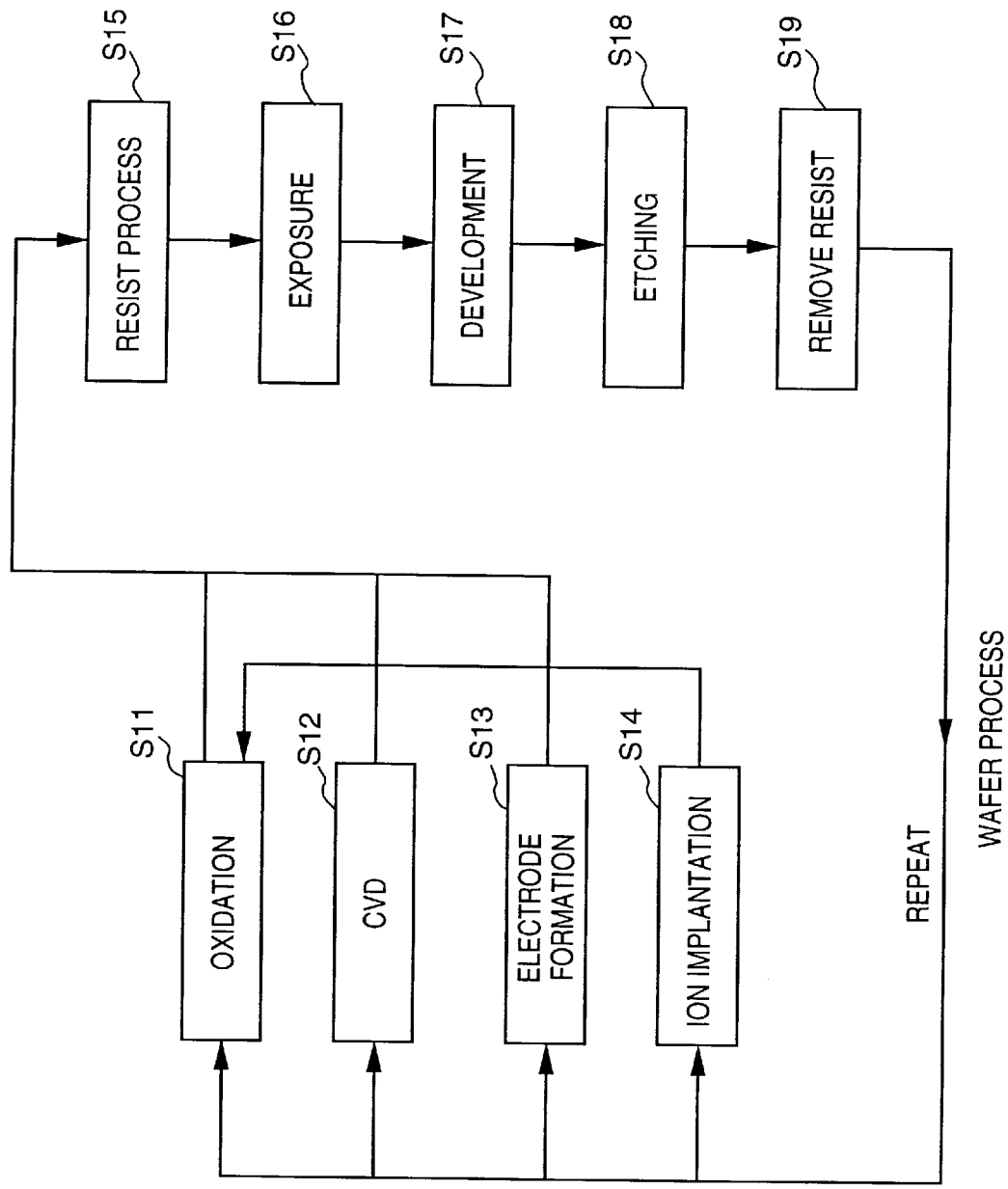
FIG. 12 is a flow chart for explaining a wafer process.
Figure 13:
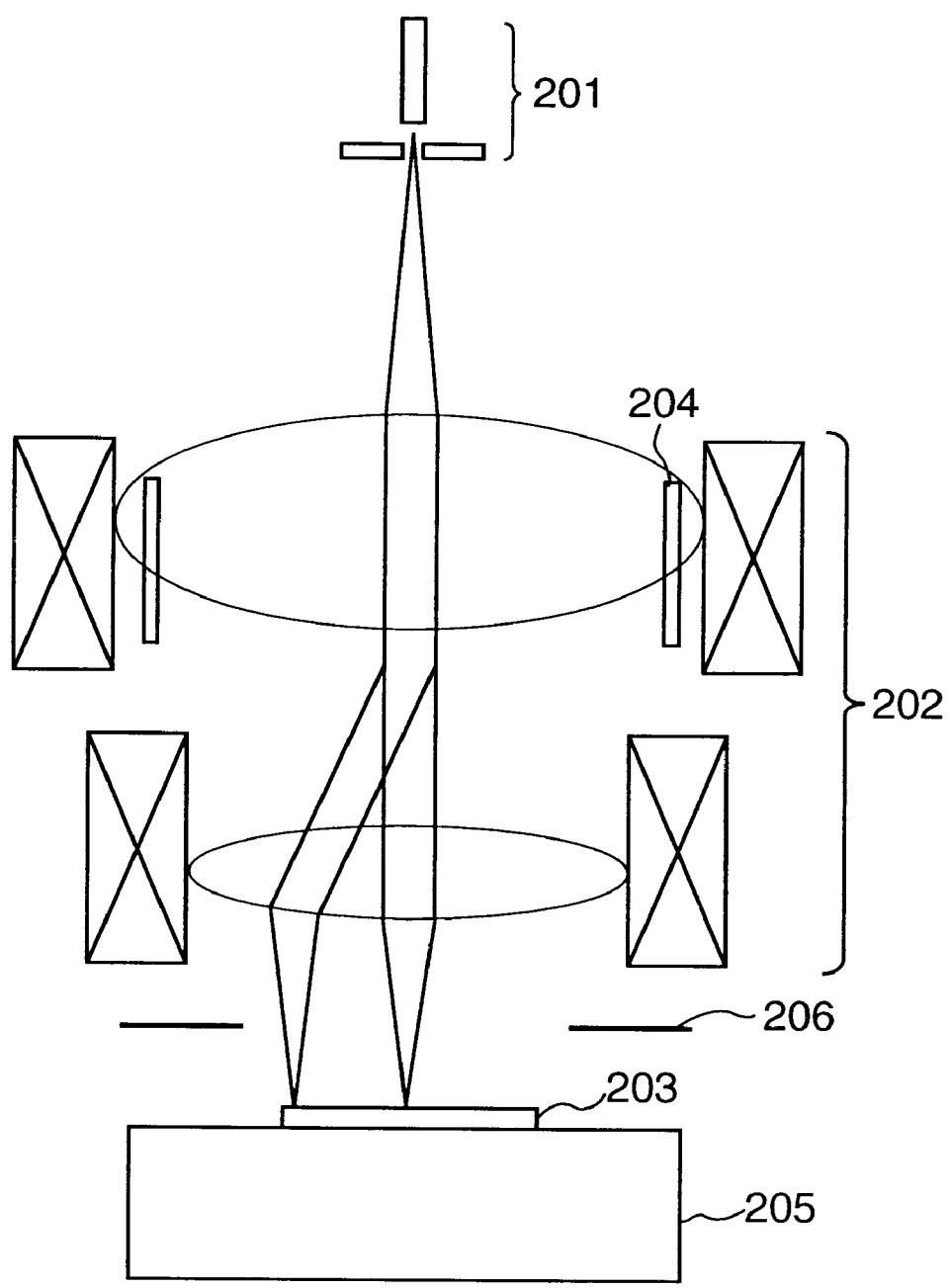
FIG. 13 is a view for explaining a conventional point beam type electron beam exposure apparatus.
Figure 14A:
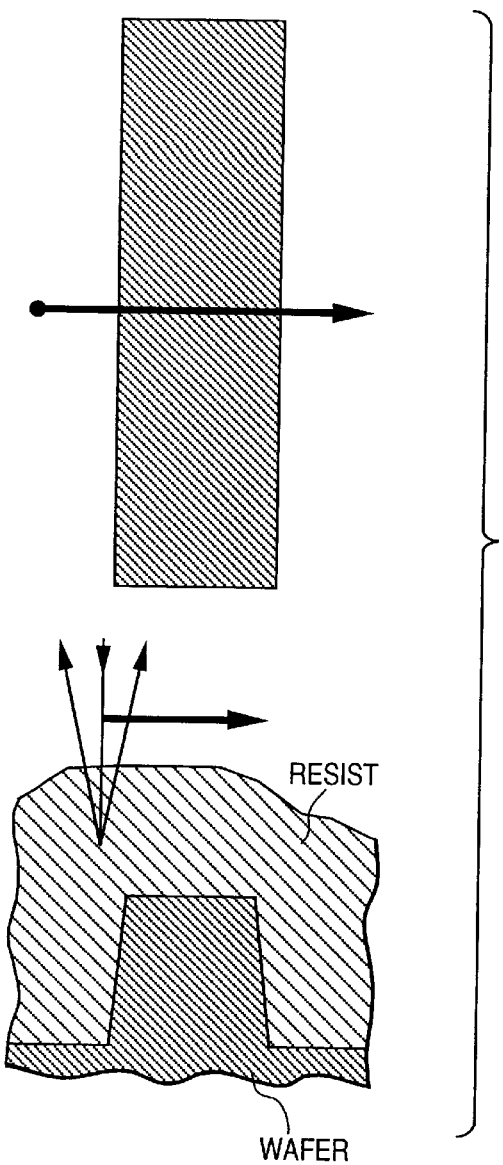
FIGS. 14A to 14C are views for explaining a conventional alignment signal.
Figure 14B:
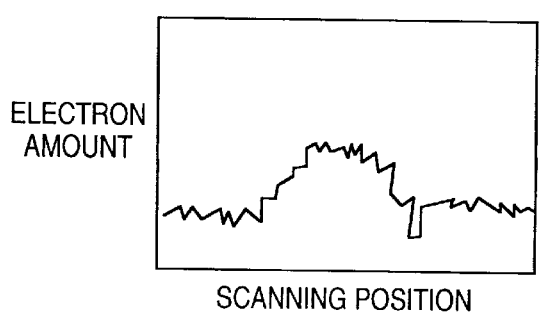
Figure 14C:
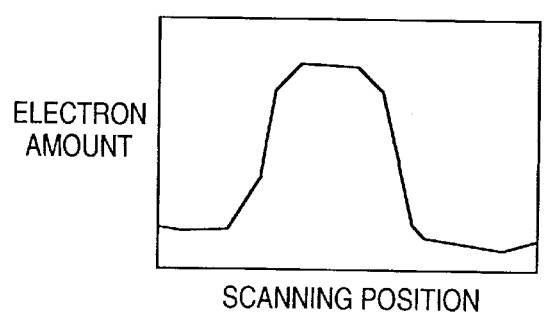

FIG. 12 shows the detailed flow of the wafer process. In step 11 (oxidation), the surface of the wafer is allowed to oxidize. In step 12 (CVD), an insulating film is formed on the wafer surface. In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern on the mask is printed on the wafer by exposure using the above-mentioned exposure apparatus. In step 17 (development), the exposed wafer is developed. In step 18 (etching), a portion other than the developed resist image is removed by etching. In step 19 (remove resist), the resist film which has become unnecessary after the etching is removed. By repetitively executing these steps, multiple circuit patterns are formed on the wafer.

According to the manufacturing method of this embodiment, a highly integrated semiconductor device which is not easy to manufacture by the conventional method can be manufactured at low cost.

As described above, according to the present invention, both alignment and pattern drawing can be done satisfactorily.

The present invention is not limited to the above embodiments and various changes and modifications can be made within the spirit and scope of the present invention. Therefore, to apprise the public of the scope of the present invention the following claims are made.

What is claimed is:

1. An electron beam exposure apparatus which draws a pattern on an object to be exposed by accelerating an electron beam emitted by an electron source using an acceleration electrode, and irradiating the electron beam onto the object to be exposed placed on a stage via an electron optical system, comprising:

deviation detection means for detecting a deviation between an irradiated position of the electron beam with respect to the stage upon applying a first acceleration voltage to the acceleration electrode, and an irradiated position of the electron beam with respect to the stage upon applying a second acceleration voltage higher than the first acceleration voltage to the acceleration electrode;

positional relationship detection means for detecting a positional relationship between the object to be exposed placed on the stage and an irradiated position of the electron beam with respect to the object to be exposed upon applying the second acceleration voltage to the acceleration electrode; and calculation means for calculating a positional relationship between the object to be exposed and the position of the electron beam with respect to the object to be exposed upon applying the first acceleration voltage to the acceleration electrode, on the basis of the deviation detected by said deviation detection means, and the positional relationship detected by said positional relationship detection means.

2. The apparatus according to claim 1, further comprising:

alignment means for aligning a position of the object to be exposed and the irradiated position of the electron beam on the basis of the positional relationship between the object to be exposed and the irradiated position of the electron beam at the first acceleration voltage, which relationship is calculated by said calculation means; and drawing means for drawing a pattern on the object to be exposed using the electron beam accelerated at the first acceleration voltage by applying the first acceleration voltage to the acceleration electrode after the alignment by said alignment means.

3. The apparatus according to claim 1, wherein said deviation detection means comprises:

first detection means for detecting a positional relationship between the stage, and the irradiated position of the electron beam with respect to the stage, upon applying the first acceleration voltage to the acceleration electrode;

second detection means for detecting a positional relationship between the stage, and the irradiated position of the electron beam with respect to the stage, upon applying the second acceleration voltage to the acceleration electrode; and means for calculating the deviation between the irradiated positions of the electron beams at the first and second acceleration voltages on the basis of detection results of said first and second detection means.

4. The apparatus according to claim 3, wherein said first and second position detection means each detect the positional relationship between the stage and the irradiated position of the electron beam by scanning the electron beam on a mark formed on the stage, and analyzing reflected electrons or secondary electrons coming from the mark at that time.

5. The apparatus according to claim 1, wherein said positional relationship detection means detects the positional relationship between the object to be exposed, and the irradiated position of the electron beam, by scanning the electron beam on a mark formed on the object to be exposed, and analyzing reflected electrons or secondary electrons coming from the mark at that time.

6. The apparatus according to claim 1, further comprising optical characteristic correction means for correcting optical characteristics of the electron optical system in accordance with the set acceleration voltage.

7. The apparatus according to claim 1, further comprising aberration correction means for correcting aberrations produced upon irradiating the electron beam onto the object to be exposed via the electron optical system.

8. A method of manufacturing a device using an electron beam exposure apparatus of claim 1.

9. A method of aligning a position of a pattern to be drawn with respect to a wafer formed with a pattern, using an electron beam exposure apparatus of claim 1.

10. An electron beam exposure apparatus for drawing a pattern on an object to be exposed by irradiating an electron beam onto the object to be exposed placed on a stage, comprising:

electron beam generation means for selectively generating a first electron beam accelerated at a first acceleration voltage or a second electron beam accelerated at a second acceleration voltage higher than the first acceleration voltage;

deviation detection means for detecting a deviation between an irradiated position of the first electron beam with respect to the stage, and an irradiated position of the second electron beam with respect to the stage;

positional relationship detection means for detecting a positional relationship between the object to be exposed placed on the stage, and an irradiated position of the second electron beam with respect to the object to be exposed; and calculation means for calculating a positional relationship between the object to be exposed, and an irradiated position of the first electron beam with respect to the object to be exposed, on the basis of the deviation detected by said deviation detection means, and the positional relationship detected by said positional relationship detection means.

11. The apparatus according to claim 10, further comprising:

alignment means for aligning a position of the object to be exposed and the irradiated position of the first electron beam on the basis of the positional relationship between the object to be exposed and the irradiated position of the first electron beam, which relationship is calculated by said calculation means; and drawing means for drawing a pattern on the object to be exposed using the first electron beam after the alignment by said alignment means.

12. The apparatus according to claim 10, wherein said deviation detection means comprises:

first detection means for detecting a positional relationship between the stage, and the irradiated position of the first electron beam with respect to the stage;

second detection means for detecting a positional relationship between the stage, and the irradiated position of the second electron beam with respect to the stage; and means for calculating the deviation between the irradiated positions of the first and second electron beams on the basis of detection results of said first and second detection means.

13. The apparatus according to claim 12, wherein said first and second position detection means each detect the positional relationship between the stage and the irradiated position of the electron beam by scanning the electron beam on a mark formed on the stage, and analyzing reflected electrons or secondary electrons coming from the mark at that time.

14. The apparatus according to claim 10, wherein said positional relationship detection means detects the positional relationship between the object to be exposed, and the irradiated position of the electron beam, by scanning the electron beam on a mark formed on the object to be exposed, and analyzing reflected electrons or secondary electrons coming from the mark at that time.

15. The apparatus according to claim 10, wherein said electron beam generation means comprises:

an electron gun;

an acceleration electrode for accelerating an electron beam emitted by said electron gun; and an acceleration voltage control circuit for setting an acceleration voltage to be applied to said acceleration electrode at the first or second acceleration voltage.

16. The apparatus according to claim 15, further comprising:

an electron optical system arranged between said electron beam generation means and the stage; and optical characteristic correction means for correcting optical characteristics of said electron optical system in accordance with the acceleration voltage.

17. The apparatus according to claim 16, further comprising aberration correction means for correcting aberrations produced upon irradiating the electron beam onto the object to be exposed via said electron optical system.

18. The apparatus according to claim 10, further comprising:
an electron optical system arranged between said electron beam generation means and the stage; and
optical characteristic correction means for correcting optical characteristics of said electron optical system in accordance with the acceleration voltage.

19. The apparatus according to claim 18, further comprising aberration correction means for correcting aberrations produced upon irradiating the electron beam onto the object to be exposed via said electron optical system.

20. A method of manufacturing a device using an electron beam exposure apparatus of claim 10.

21. A method of aligning a position of a pattern to be drawn with respect to a wafer formed with a pattern, using an electron beam exposure apparatus of claim 10.

22. A method of controlling an electron beam exposure apparatus which draws a pattern on an object to be exposed by accelerating an electron beam emitted by an electron source using an acceleration electrode, and irradiating the electron beam onto the object to be exposed placed on a stage via an electron optical system, comprising:
the deviation detection step of detecting a deviation between an irradiated position of the electron beam with respect to the stage upon applying a first acceleration voltage to the acceleration electrode, and an irradiated position of the electron beam with respect to the stage upon applying a second acceleration voltage higher than the first acceleration voltage to the acceleration electrode;
the positional relationship detection step of detecting a positional relationship between the object to be exposed placed on the stage and an irradiated position of the electron beam with respect to the object to be exposed upon applying the second acceleration voltage to the acceleration electrode; and
the calculation step of calculating a positional relationship between the object to be exposed and the position of the electron beam with respect to the object to be exposed upon applying the first acceleration voltage to the acceleration electrode, on the basis of the deviation detected in the deviation detection step, and the positional relationship detected in the positional relationship detection step.

23. The method according to claim 22, further comprising:
the alignment step of aligning a position of the object to be exposed and the irradiated position of the electron beam on the basis of the positional relationship between the object to be exposed and the irradiated position of the electron beam at the first acceleration voltage, which relationship is calculated in the calculation step; and
the drawing step of drawing a pattern on the object to be exposed using the electron beam accelerated at the first acceleration voltage by applying the first acceleration voltage to the acceleration electrode.

24. The method according to claim 22, wherein the deviation detection step comprises:
the first detection step of detecting a positional relationship between the stage, and the irradiated position of the election beam with respect to the stage, upon applying the first acceleration voltage to the acceleration electrode;
the second detection step of detecting a positional relationship between the stage, and the irradiated position of the electron beam with respect to the stage, upon applying the second acceleration voltage to the acceleration electrode; and
the step of calculating the deviation between the irradiated positions of the electron beams at the first and second acceleration voltages on the basis of detection results in the first and second detection steps.

25. The method according to claim 24, wherein the first and second position detection steps each include the step of detecting the positional relationship between the stage and the irradiated position of the electron beam by scanning the electron beam on a mark formed on the stage, and analyzing reflected electrons or secondary electrons coming from the mark at that time.

26. The method according to claim 22, wherein the positional relationship detection step includes the step of detecting the positional relationship between the object to be exposed, and the irradiated position of the electron beam, by scanning the electron beam on a mark formed on the object to be exposed, and analyzing reflected electrons or secondary electrons coming from the mark at that time.

27. The method according to claim 22, further comprising the optical characteristic correction step of correcting optical characteristics of the electron optical system in accordance with the set acceleration voltage.

28. The method according to claim 22, further comprising the aberration correction step of correcting aberrations produced upon irradiating the electron beam onto the object to be exposed via the electron optical system.

29. A method of controlling an electron beam exposure apparatus for drawing a pattern on an object to be exposed by irradiating an electron beam onto the object to be exposed placed on a stage, comprising:
the step of setting a first or second acceleration voltage in electron beam generation means for generating a first electron beam accelerated at the first acceleration voltage or a second electron beam accelerated at the second acceleration voltage higher than the first acceleration voltage;
the deviation detection step of detecting a deviation between an irradiated position of the first electron beam with respect to the stage, and an irradiated position of the second electron beam with respect to the stage;
the positional relationship detection step of detecting a positional relationship between the object to be exposed placed on the stage, and an irradiated position of the second electron beam with respect to the object to be exposed; and
the calculation step of calculating a positional relationship between the object to be exposed, and an irradiated position of the first electron beam with respect to the object to be exposed, on the basis of the deviation detected in the deviation detection step, and the positional relationship detected in the positional relationship detection step.

30. The method according to claim 29, further comprising:
the alignment step of aligning a position of the object to be exposed and the irradiated position of the first electron beam on the basis of the positional relationship between the object to be exposed and the irradiated position of the first electron beam, which relationship is calculated in the calculation step; and
the drawing step of drawing a pattern on the object to be exposed using the first electron beam.

31. The method according to claim 29, wherein the deviation detection step comprises:

the first detection step of detecting a positional relationship between the stage, and the irradiated position of the first electron beam with respect to the stage;

the second detection step of detecting a positional relationship between the stage, and the irradiated position of the second electron beam with respect to the stage; and the step of calculating the deviation between the irradiated positions of the first and second electron beams on the basis of detection results in the first and second detection steps.

32. The method according to claim 31, wherein the first and second position detection steps each include the step of detecting the positional relationship between the stage and the irradiated position of the electron beam by scanning the electron beam on a mark formed on the stage, and analyzing reflected electrons or secondary electrons coming from the mark at that time.

33. The method according to claim 29, wherein the positional relationship detection step includes the step of detecting the positional relationship between the object to be exposed, and the irradiated position of the electron beam, by scanning the electron beam on a mark formed on the object to be exposed, and analyzing reflected electrons or secondary electrons coming from the mark at that time.

34. The method according to claim 33, wherein said electron beam exposure apparatus has an electron optical system arranged between said electron beam generation means and the stage, and said method further comprises:

the optical characteristic correction step of correcting optical characteristics of said electron optical system in accordance with the acceleration voltage.

35. The method according to claim 34, further comprising the aberration correction step of correcting aberrations produced upon irradiating the electron beam onto the object to be exposed via said electron optical system.

36. The method according to claim 29, wherein said electron beam exposure apparatus has an electron optical system arranged between said electron beam generation means and the stage, and said method further comprises:

the optical characteristic correction step of correcting optical characteristics of said electron optical system in accordance with the acceleration voltage.

37. The method according to claim 36, further comprising the aberration correction step of correcting aberrations produced upon irradiating the electron beam onto the object to be exposed via said electron optical system.

* * * * *

UNITED STATES PATENT AND TRADEMARK OFFICE
CERTIFICATE OF CORRECTION

PATENT NO. : 5,939,725

DATED : August 17, 1999

INVENTOR : MASATO MURAKI

It is certified that error appears in the above-identified patent and that said Letters Patent is hereby corrected as shown below:

COLUMN 12:
Line 32, "Sill" should read --S111--.

COLUMN 15:
Line 28, "1̂→2̂→3̂→4̂→,...," should read --①→②→③→④,...,--; and
Line 34, "1̂)" should read --①)--, and "2̂)." should read --②).--.

Signed and Sealed this

Sixteenth Day of May, 2000

Attest:

Q. TODD DICKINSON

Attesting Officer

Director of Patents and Trademarks